(12) United States Patent
Uchida et al.

(10) Patent No.: US 9,929,307 B2
(45) Date of Patent: Mar. 27, 2018

(54) LIGHT EMITTING DEVICE, LIGHT SOURCE SYSTEM INCLUDING THE LIGHT EMITTING DEVICE, AND OPTICAL COHERENCE TOMOGRAPHY INCLUDING THE LIGHT SOURCE SYSTEM

(71) Applicant: CANON KABUSHIKI KAISHA, Tokyo (JP)

(72) Inventors: Takeshi Uchida, Hiratsuka (JP); Takeshi Yoshioka, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/129,162

(22) PCT Filed: Mar. 25, 2015

(86) PCT No.: PCT/JP2015/060307
§ 371 (c)(1),
(2) Date: Sep. 26, 2016

(87) PCT Pub. No.: WO2015/147334
PCT Pub. Date: Oct. 1, 2015

(65) Prior Publication Data
US 2017/0125629 A1    May 4, 2017

(30) Foreign Application Priority Data
Mar. 27, 2014 (JP) ................. 2014-067023

(51) Int. Cl.
*H01L 29/06* (2006.01)
*H01L 33/00* (2010.01)
(Continued)

(52) U.S. Cl.
CPC ...... *H01L 33/0045* (2013.01); *G01B 9/02091* (2013.01); *H01L 33/06* (2013.01);
(Continued)

(58) Field of Classification Search
None
See application file for complete search history.

(56) References Cited

U.S. PATENT DOCUMENTS

| 5,033,053 A | 7/1991 | Shimizu et al. |
| 5,521,935 A | 5/1996 | Irikawa |
| (Continued) | | |

FOREIGN PATENT DOCUMENTS

| CN | 102315344 A | 1/2012 |
| CN | 103325777 A | 9/2013 |
| (Continued) | | |

OTHER PUBLICATIONS

Semenov, A.T., et al., "Very High Power Superluminescent Diodes as Alternative to Fluorescent Fiber-Doped Light Sources", SPIE Conference on Fiber Optic Sensor Technology and Applications, Sep. 1999, pp. 480-487, vol. 3860.

*Primary Examiner* — David E Graybill
(74) *Attorney, Agent, or Firm* — Canon USA Inc., IP Division

(57) ABSTRACT

The present invention provides a light emitting device which emit light having a high-order level without increasing a current injection density to an active layer. A light emitting device according to the present invention includes an upper electrode layer, a lower electrode layer, and an active layer provided between them. In this case, light is emitted by injection of electric current to the active layer through the upper electrode layer and the lower electrode layer, the active layer has a plurality of quantum-confined structures, and a first quantum-confined structure has a ground level having an energy level $E_0$ and a high-order level having an energy level $E_1$, and a second quantum-confined structure has an energy level $E_2$ which is higher than the $E_0$, and the $E_1$ and the $E_2$ are substantially matched.

18 Claims, 30 Drawing Sheets

(51) Int. Cl.
*H01L 33/38* (2010.01)
*H01L 33/06* (2010.01)
*H01L 33/14* (2010.01)
*H01L 33/20* (2010.01)
*G01B 9/02* (2006.01)
*H01L 33/30* (2010.01)

(52) U.S. Cl.
CPC ............ *H01L 33/145* (2013.01); *H01L 33/20* (2013.01); *H01L 33/38* (2013.01); *H01L 33/30* (2013.01)

(56) References Cited

U.S. PATENT DOCUMENTS

| | | | |
|---|---|---|---|
| 7,960,743 B2* | 6/2011 | Doussiere | H01L 27/15 257/86 |
| 2007/0153855 A1 | 7/2007 | Suzuki et al. | |
| 2010/0032552 A1* | 2/2010 | Doshida | B82Y 20/00 250/225 |
| 2010/0140632 A1* | 6/2010 | Doussiere | H01L 27/15 257/88 |
| 2010/0259758 A1 | 10/2010 | Asano | |
| 2011/0176142 A1* | 7/2011 | Hacker | A61B 3/102 356/479 |
| 2012/0327422 A1 | 12/2012 | Inao et al. | |
| 2013/0242310 A1* | 9/2013 | Matsuu | H01L 33/0045 356/479 |
| 2014/0355000 A1* | 12/2014 | Uchida | G01N 21/4795 356/456 |

FOREIGN PATENT DOCUMENTS

| | | | | |
|---|---|---|---|---|
| JP | 03228380 A | * | 10/1991 | ............ H01L 24/45 |
| JP | 4-177784 A | | 6/1992 | |
| JP | 2007-149808 A | | 6/2007 | |
| JP | 2007-184557 A | | 7/2007 | |
| JP | 2009-283736 A | | 12/2009 | |
| JP | 2012-019218 A | | 1/2012 | |
| JP | 2013-004903 A | | 1/2013 | |
| JP | 2013-197237 A | | 9/2013 | |
| WO | 2002/025705 A2 | | 3/2002 | |
| WO | WO 2013081158 A1 | * | 6/2013 | ......... G01N 21/4795 |
| WO | 2014/051137 A1 | | 4/2014 | |

\* cited by examiner

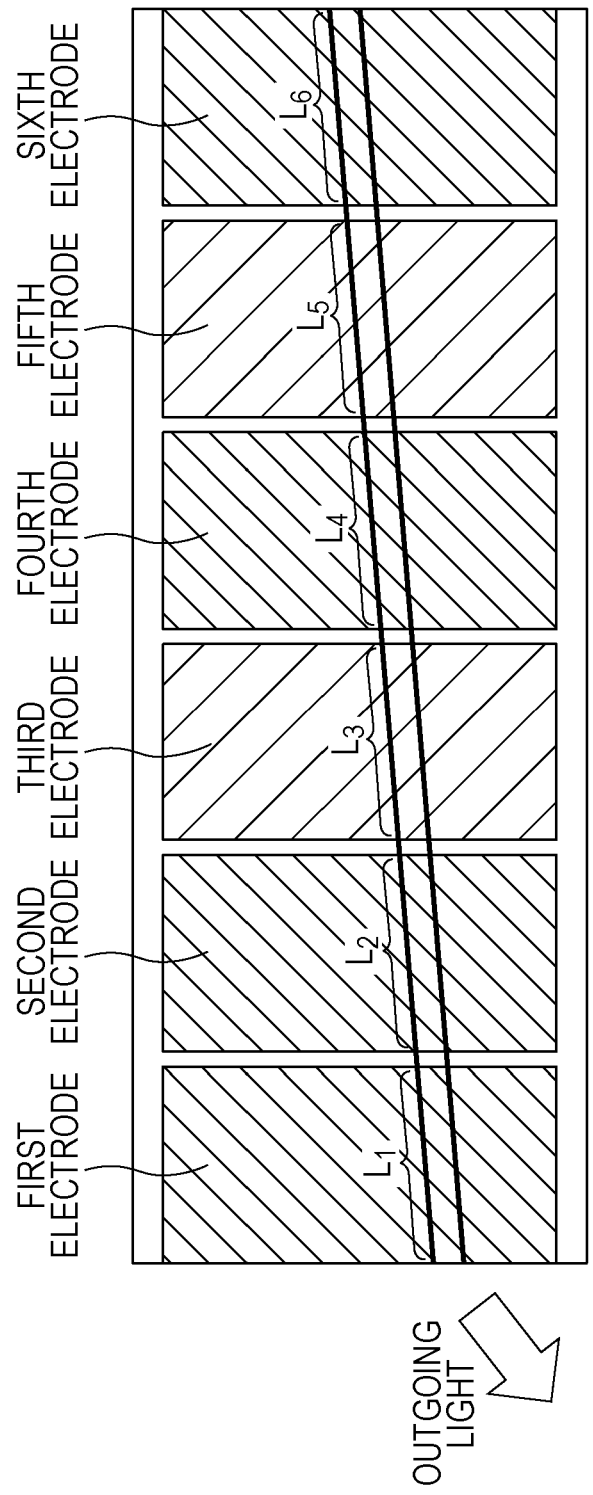

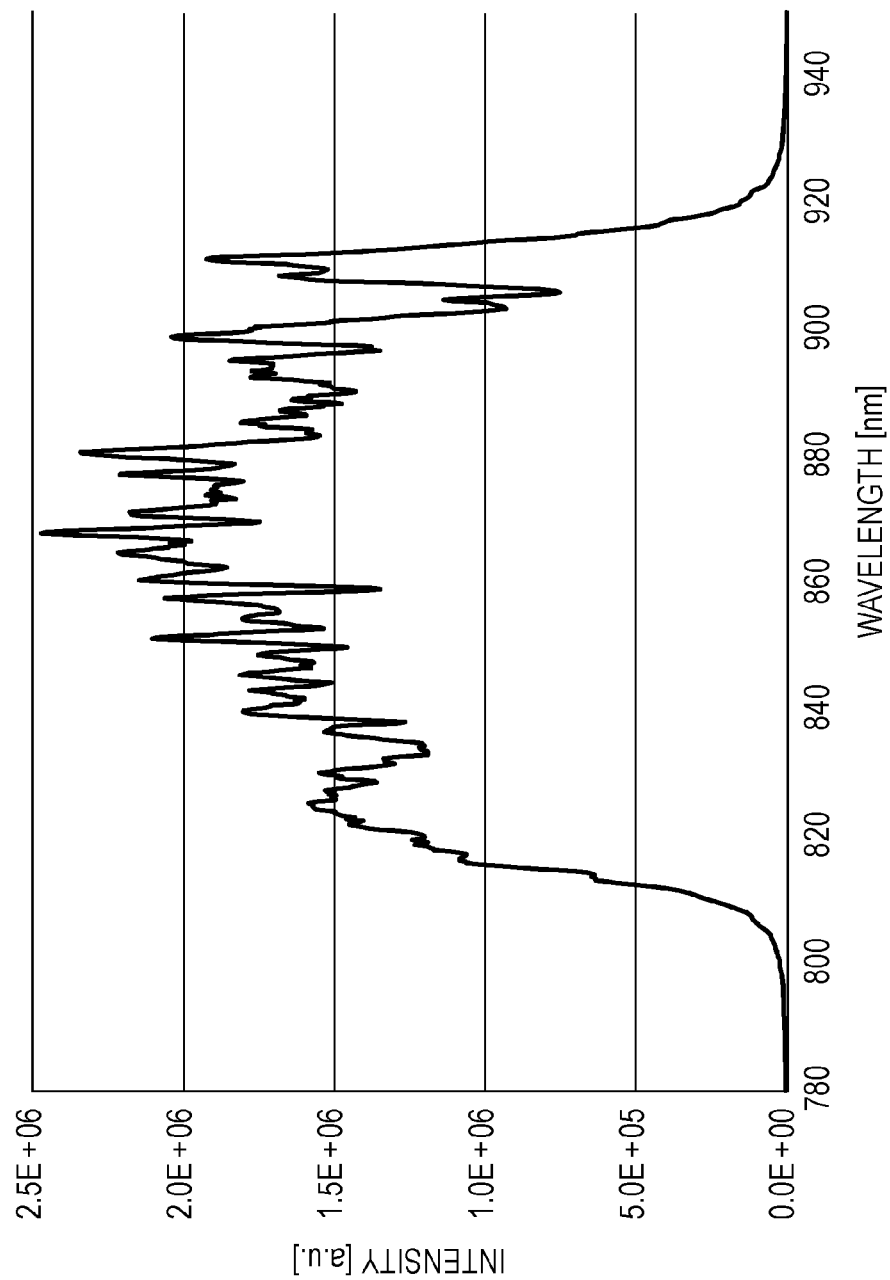

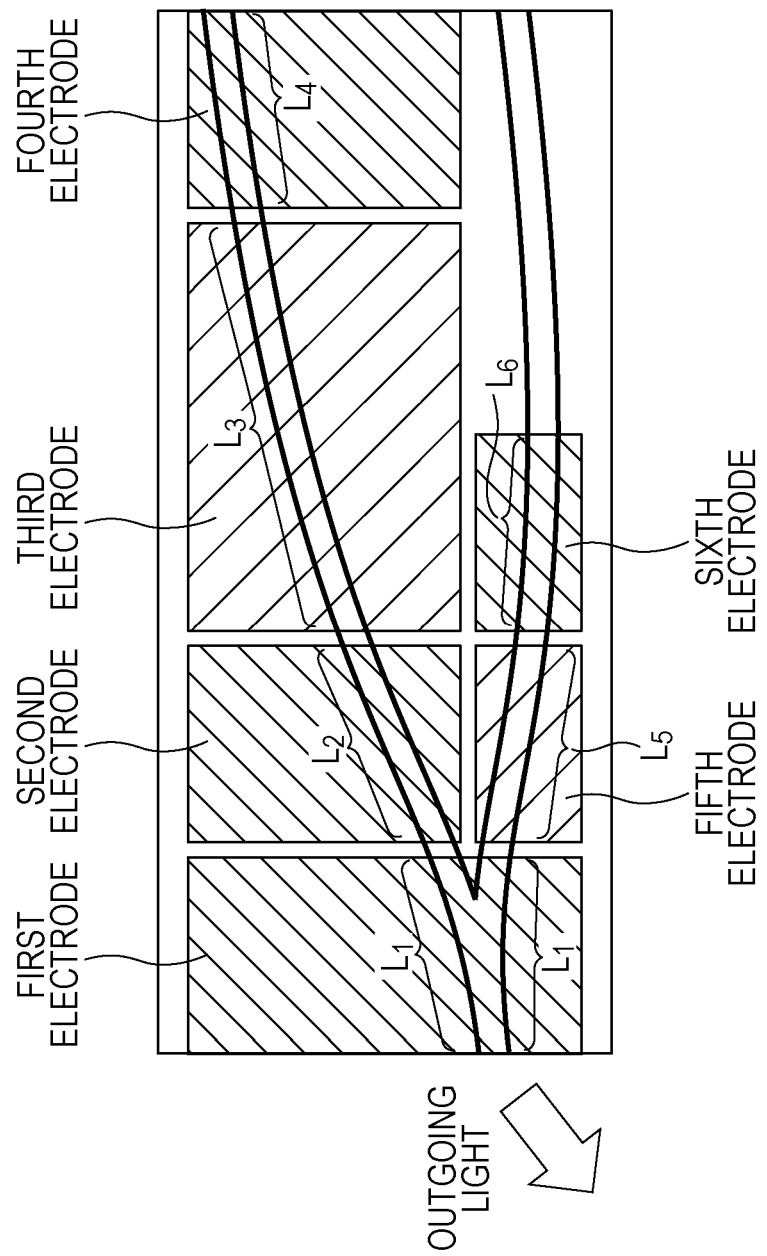

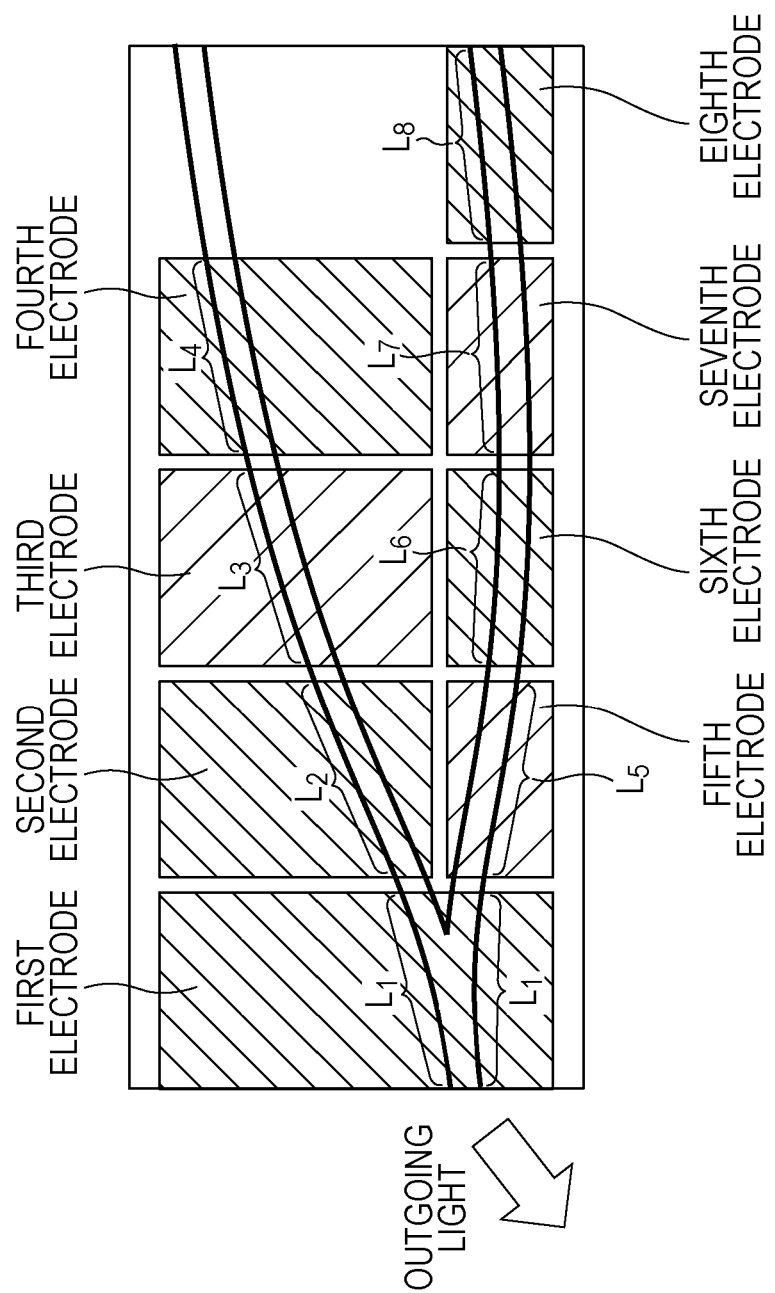

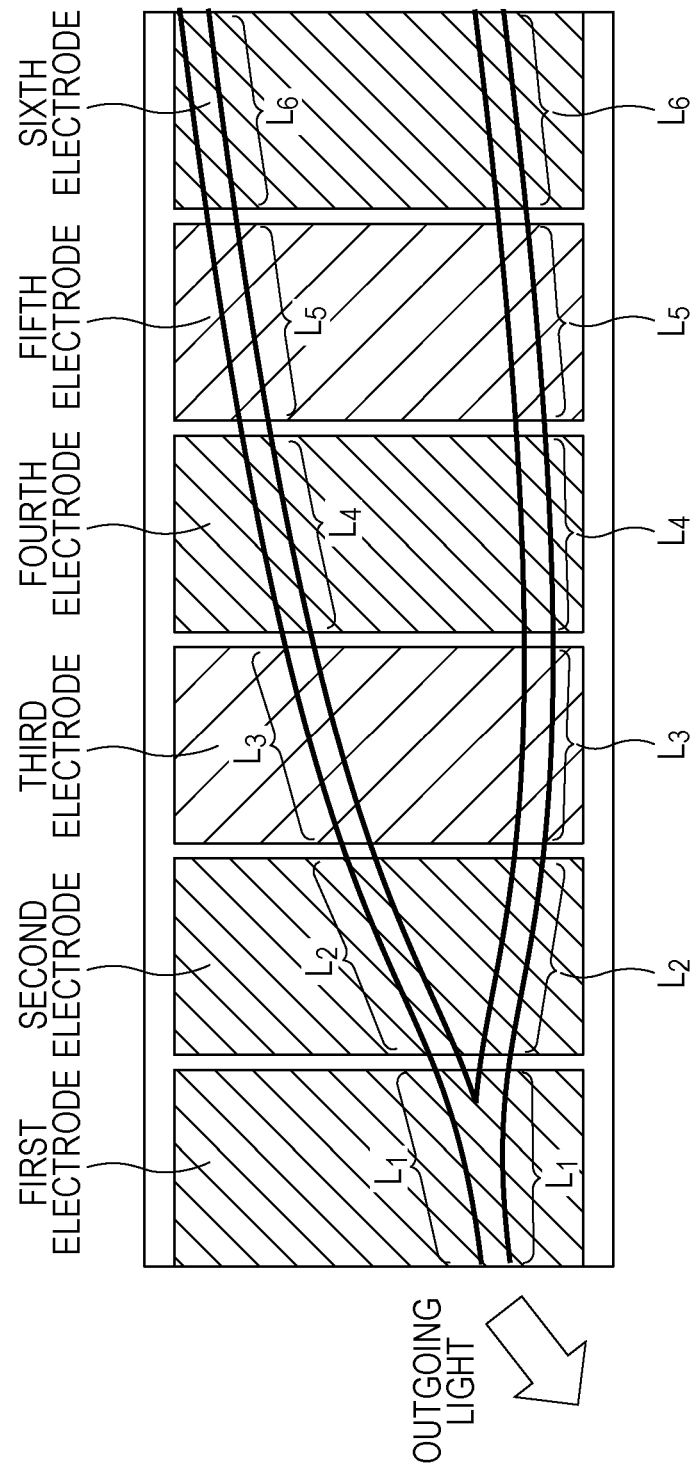

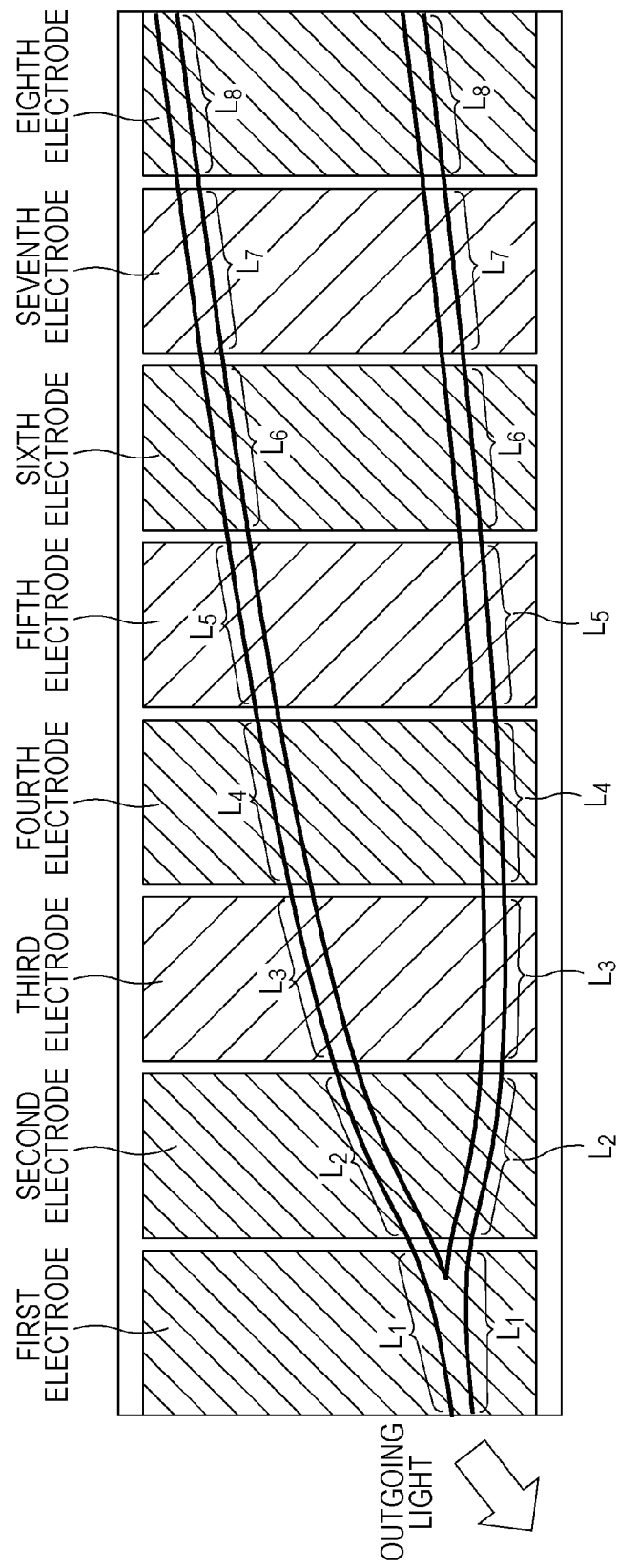

LIGHT EMITTING DEVICE, LIGHT SOURCE SYSTEM INCLUDING THE LIGHT EMITTING DEVICE, AND OPTICAL COHERENCE TOMOGRAPHY INCLUDING THE LIGHT SOURCE SYSTEM

TECHNICAL FIELD

The present invention relates to a light emitting device, a light source system including the light emitting device, and an optical coherence tomography including the light source system.

BACKGROUND ART

A super luminescent diode is a light emitting device capable of providing a relative high optical output of 1 mW or higher like a semiconductor laser while having a wide-band spectrum distribution like a light emitting diode. Such a super luminescent diode will be called an SLD in some descriptions below. The SLD have received attentions in medical fields and measurement fields because of its characteristics and may be used as a light source in optical coherence tomography (OCT) capable of acquiring a tomogram of a biological tissue, for example. As a light source in OCT, an SLD may be applicable which has a wide light emission wavelength band for a higher depth resolution. According to NPL 1, in order to increase a light emission wavelength band of an SLD, a single quantum well structure is used which has a plurality of different energy levels of an emission spectrum as an active layer. Electric current to be injected to the active layer of the SLD may be increased to produce light emission with a ground level corresponding to emitted light having a long wavelength and light emission with a high-order level (primary level) corresponding to emitted light having a short wavelength and thus achieve an emission spectrum having a half-width of 48 nm.

CITATION LIST

Non Patent Literature

NPL 1 SPIE Vol. 3860, pp. 480-487

Technical Problem

However, in order to achieve light emission with a high-order level as in NPL 1, a high current injection density to an active layer may be required. A high current injection density may increase the amount of emitted light of the active layer, which may disadvantageously result in a shorter life. Accordingly, in view of the problem, the present invention may provide a light emitting device which may achieve light emission having a high-order level without increasing a current injection density to an active layer.

SUMMARY OF INVENTION

A light emitting device according to the present invention includes an upper electrode layer, a lower electrode layer, and an active layer provided between them. In this case, light is emitted by injection of electric current to the active layer through the upper electrode layer and the lower electrode layer, the active layer has a plurality of quantum-confined structures, and a first quantum-confined structure has a ground level having an energy level $E_0$ and a high-order level having an energy level $E_1$, and a second quantum-confined structure different from the first quantum-confined structure has an energy level $E_2$ which is higher than the $E_0$, and the $E_1$ and the $E_2$ are substantially matched.

Further features of the present invention will become apparent from the following description of exemplary embodiments with reference to the attached drawings.

BRIEF DESCRIPTION OF DRAWINGS

FIG. 18A is a diagram for explaining a configuration of a light emitting device according to an eighth example of the present invention, and FIG. 18B is a graph illustrating a measurement result of an emission spectrum generated by a light emitting device.

FIGS. 21B to 21D are diagrams for explaining of another configuration of a light emitting device according to the eleventh example of the present invention.

FIG. 22A is a diagram for explaining a configuration of a light emitting device according to a twelfth example of the present invention.

FIGS. 23B and 23C are diagrams for explaining another configuration of the light emitting device according to the thirteenth example of the present invention.

DESCRIPTION OF EMBODIMENTS

Exemplary embodiments of the present invention will be described, but it should be understood that the present invention is not limited thereto.

Light Emitting Device

First Exemplary Embodiment

Figure 1A:
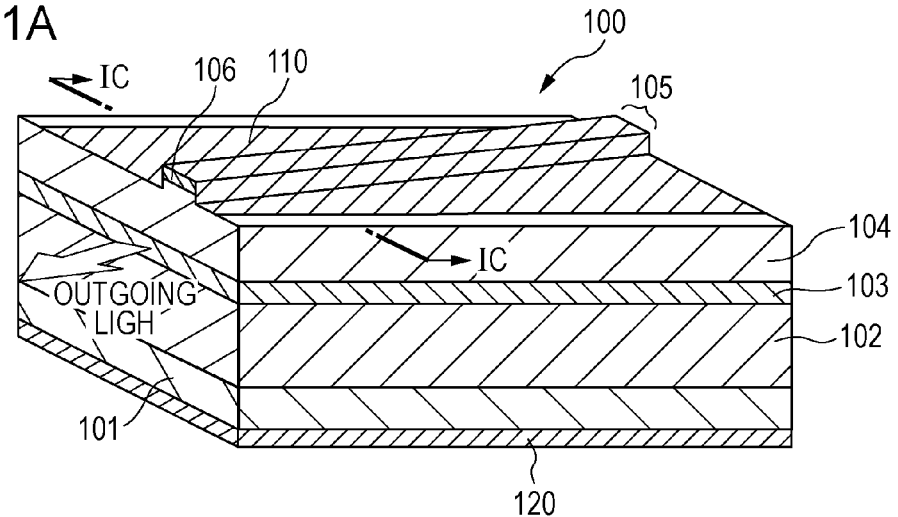
FIGS. 1A to 1C are diagrams for explaining a configuration of a light emitting device according to a first exemplary embodiment of the present invention.
Figure 1B:
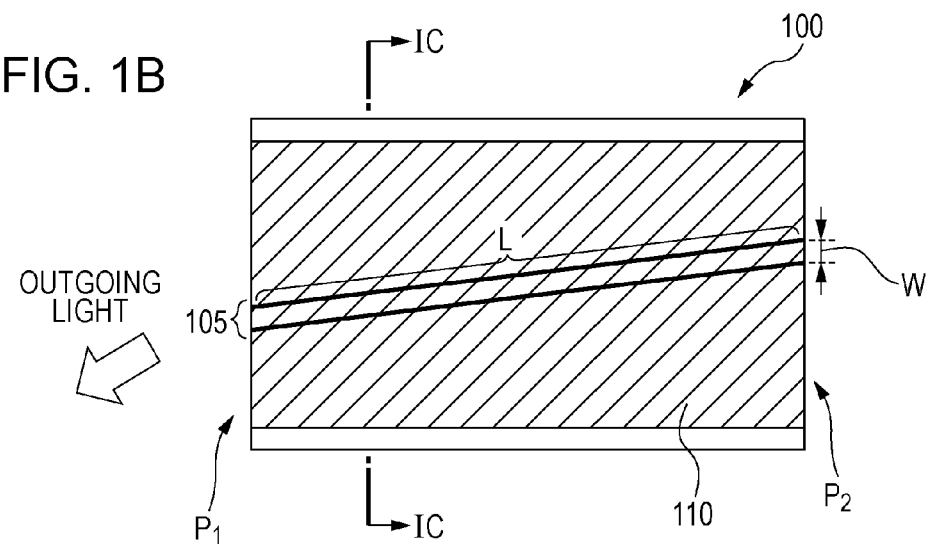
Figure 1C:
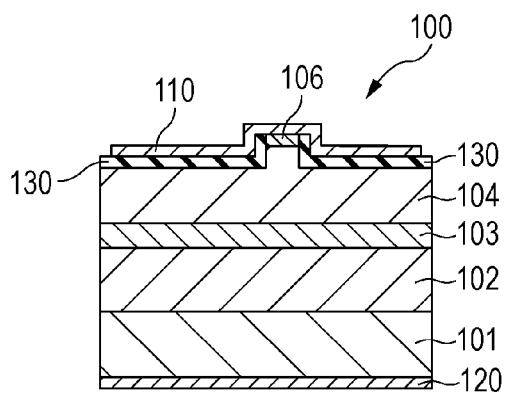

A light emitting device and a light source system according to a first exemplary embodiment of the present invention will be described with reference to FIGS. 1A to 1C and FIG. 2. FIGS. 1A and 1B are a perspective view and a top view, respectively, of a light emitting device according to this exemplary embodiment and FIG. 1C is a cross section view taken in the line IC-IC in FIGS. 1A and 1B.

A light emitting device 100 according to this exemplary embodiment sequentially includes a lower clad layer (n-type clad layer) 102, an active layer 103, an upper clad layer (p-type clad layer) 104, and an upper electrode layer 110 on a substrate (n-type substrate) 101. The upper clad layer 104 and the upper electrode layer 110 have a ridge optical waveguide structure 105. An upper electrode layer (p-type electrode) 110 is provided over the ridge optical waveguide structure 105 through a contact layer 106. An insulating layer 130 (illustrated in FIG. 1C) is provided between the upper electrode layer 110 and the upper clad layer 104, and electric current is injected from the upper electrode layer 110 to the active layer 103 through the contact layer 106. In other words, in FIGS. 1A to 1C, the upper electrode layer 110 is provided substantially entirely over the semiconductor device, but electric current is injected from an upper part of the ridge waveguide structure 105 to the active layer in the upper electrode layer 110. A lower electrode layer 120 is provided on a surface which does not have the lower clad layer 102 of main surfaces of the substrate 101.

The light emitting device 100 according to this exemplary embodiment applies voltage between the upper electrode layer 110 and the lower electrode layer 120 to inject electric current to the active layer 103 and thus emit light and guides the waves in a longitudinal direction (or in-plane direction within the active layer) of the ridge optical waveguide structure 105. Then, light is emitted in the direction indicated by a white arrow in FIGS. 1A and 1B. A surface from which light is emitted of an end face of the light emitting device 100 will be called an outgoing end face. FIG. 1B illustrates an outgoing end face $P_1$ and an end face $P_2$ opposite against the outgoing end face of a light emitting device according to this exemplary embodiment. The light emitted from the outgoing end face $P_1$ is bounded to an optical member such as a lens and an optical fiber. An anti-reflective member or a material which absorbs light may be provided as required on the end face $P_2$ against the outgoing end face to prevent reflection of light.

The density of current to be injected to the active layer 103 may be adjusted properly to change the width and intensity of a wavelength band, that is, the shape of an emission spectrum of emitted light.

The light emitting device 100 according to this exemplary embodiment may have an emitted light detection unit configured to detect an intensity of emitted light.

The light emitting device according to this exemplary embodiment performs similar light confinement to that of edge emitting laser in the past. More specifically, a semiconductor layer configuration is provided in which an active layer having two or more quantum-confined structures having a relationship which will be described below and the active layer is sandwiched by clad layers having a lower index of refraction than that of the active layer. The difference in index of refraction between the active layer and the clad layers allows confinement of light in a direction perpendicular to the in-plane direction of the active layer. The light confinement parallel to the in-plane direction of the active layer may lead a structure having an index of refraction that changes equivalently. Thus, a part having a high index of refraction thereof may be provided in a stripe shape to implement a light guide structure. Electric current may be injected to the light guide part to cause an inversion distribution in the active layer so that light amplification by stimulated emission (hereinafter, called induced amplification) may be provided. A light emitting device in which light passes through between the end face $P_1$ and the end face $P_2$ (fundamentally) only once, undergoes induced amplification and is emitted will be called a super luminescent diode (SLD). Such an SLD may cause the induced amplification to emit light having a wide wavelength band of several tens nm to 100 nm or more at an output as high as several mW to several tens mW or more.

Light Source System

Figure 2:
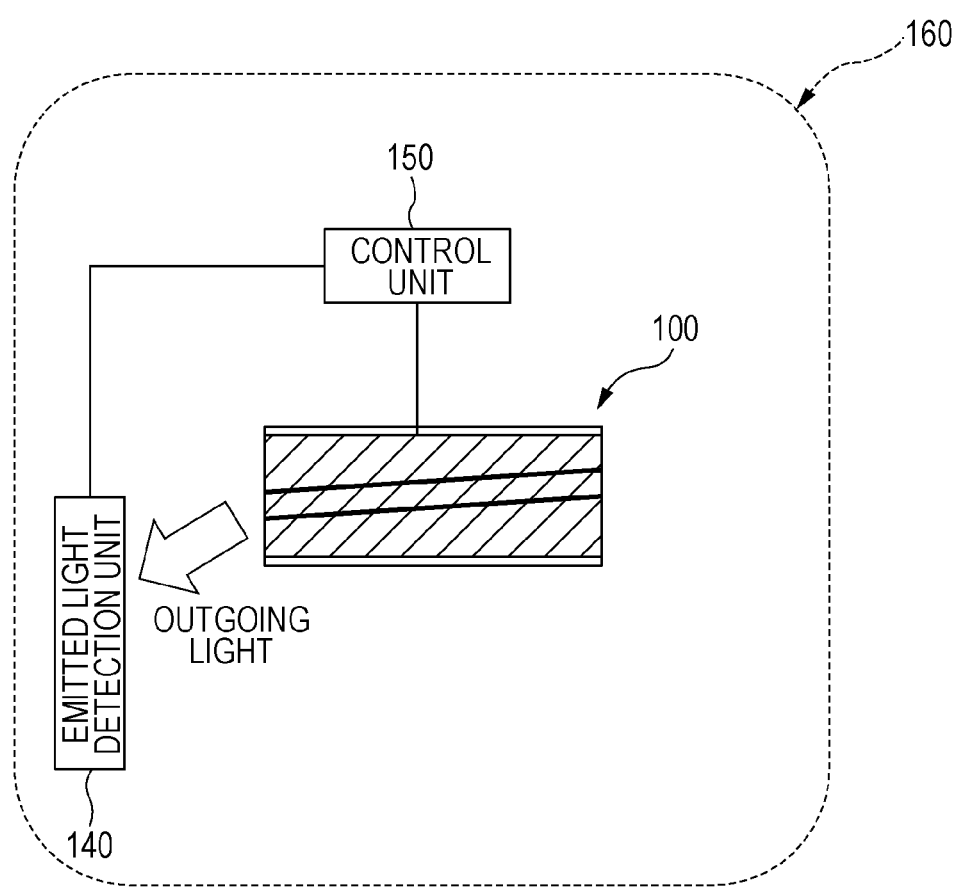
FIG. 2 is a diagram for explaining a configuration of a light source system according to the first exemplary embodiment of the present invention.

Next, a light source system according to this exemplary embodiment will be described with reference to FIG. 2. FIG. 2 is a block diagram illustrating a light source system according to this exemplary embodiment, and a top view of the light emitting device 100 is illustrated in FIG. 2.

A light source system 160 according to this exemplary embodiment includes a control unit 150 configured to control current injection densities to the upper electrode layer 110 and lower electrode layer 120. The light source system 160 according to this exemplary embodiment may have the emitted light detection unit 140 which detects an intensity of emitted light, and the control unit 150 may be configured to allow control of a current injection density to each electrode in accordance with the intensity of light detected by the emitted light detection unit 140.

Quantum-Confined Structure

The light emitting device according to this exemplary embodiment may have the active layer having at least one of a quantum well structure, a quantum wire structure, and a quantum dot structure. Such a quantum well structure, a quantum wire structure, and quantum dot structure may collectively be called a quantum-confined structure. The light emitting device according to this exemplary embodiment may have a plurality of quantum-confined structures. A first quantum-confined structure has a ground level having an energy level of $E_0$ and a high-order level having an energy level of $E_1$. A second quantum-confined structure has a ground level having an energy level of $E_2$ which is higher than $E_0$. $E_1$ and $E_2$ are substantially matched. The term "high-order level" herein refers to a light hole excluding a heavy hole of a ground level and a primary energy level or higher.

A quantum well structure, for example, which is a kind of a quantum-confined structure will main be described below.

Effects of use of a quantum well structure according to this exemplary embodiment will be described in detail with reference to a band diagram illustrated in FIGS. 3A to 3C. The term "emitted light" may include both of spontaneous emitted light and simulated emitted light otherwise specified.

According to this exemplary embodiment, the active layer 103 has a multiple quantum well structure 170 having a first quantum well structure 171 and a second quantum well structure 172. According to this exemplary embodiment, the first quantum well structure 171 has a ground level having an energy level $E_0$ and a high-order level having an energy level $E_1$. The second quantum well structure 172 has a ground level having an energy level $E_2$. $E_1$ and $E_2$ are substantially matched. A hole in this description and drawings has a heavy hole ground level.

The energy levels $E_1$ and $E_2$ are substantially matched so that emitted light due to spontaneous emission from the ground level $E_2$ of the second quantum well structure 172 and the high-order level $E_1$ of the first quantum well structure 171 may cause induced amplification with the ground level $E_2$ of the second quantum well structure 172 and the high-order level $E_1$ of first quantum well structure 171 and may increase the emission intensity at a high-order level (short wavelength). Because $E_1$ has a high-order level, a high current injection density may be required for light emission and induced amplification from the level. However, because $E_2$ has a ground level though it has an equal energy level to that of $E_1$, emitted light and simulated emission may be caused by a lower current injection density than that for light emission with $E_1$. Accordingly, compared with a quantum well structure including the first quantum well structure 171 only, the structure further including the quantum well 172 may require a carrier density which is reduced twice or less and at the same time generate emitted light and gain for two levels. Thus, in a case where generation of emitted light and gain having equal magnitudes to those of a structure having the single quantum well 171 only, a lower carrier density may be required for achieving it. As a result, light emission with a low current injection density may be achieved.

Figure 3A:
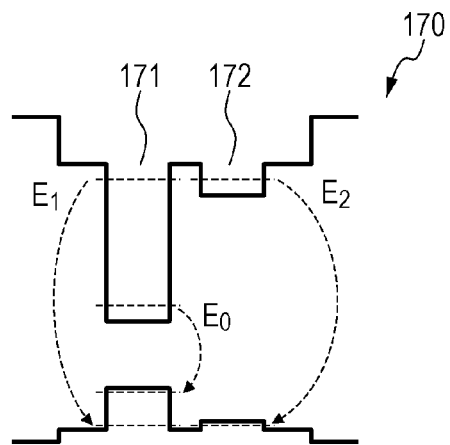
FIGS. 3A to 3C are diagrams for explaining a band diagram of a quantum well structure according to the first exemplary embodiment of the present invention.

A smaller depth of the second quantum well structure 172 than the depth of the second quantum well structure 171, as in FIG. 3A may easily cause light emission having a ground level of the second quantum well structure.

Having described the multiple quantum well structure 170 of the active layer is a double quantum well structure having the first quantum well structure 171 and the second quantum well structure 172, a multiple quantum well structure having three or more quantum well structures may be used.

Figure 3B:
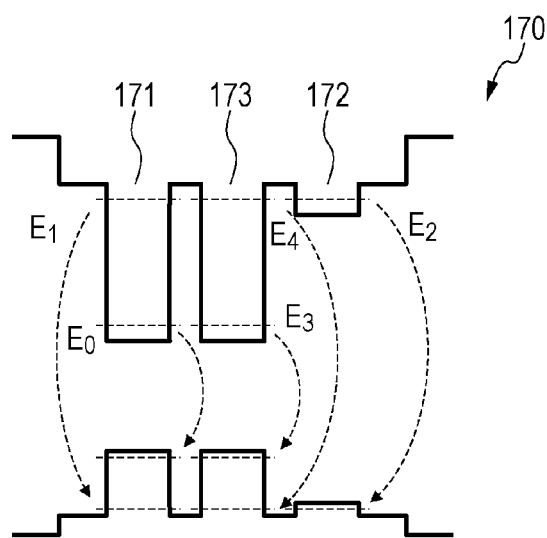

For example, as illustrated in FIG. 3B, the multiple quantum well structure 170 may further include a third quantum well structure 173 in addition to the first quantum well structure 171 and the second quantum well structure 172. The third quantum well structure 173 has a ground level having an energy level $E_3$ and a high-order level having an energy level $E_4$. The energy levels $E_3$ and $E_0$ and $E_4$, $E_1$ and $E_2$ are substantially matched. Thus, emitted light from the ground level $E_2$ of the first quantum well structure 171 may easily produce a higher emission intensity of a short wavelength band from the high-order level because induced amplification caused by emitted light from $E_4$ of the third quantum well structure occurs in addition to induced amplification caused by emitted light from $E_1$ of the first quantum well structure. In other words, a lower current injection density may be required for acquiring predetermined emission intensity. Therefore, the active layer may have such a third quantum well structure, and the third quantum well structure may be the same as the first quantum-confined structure.

Figure 3C:
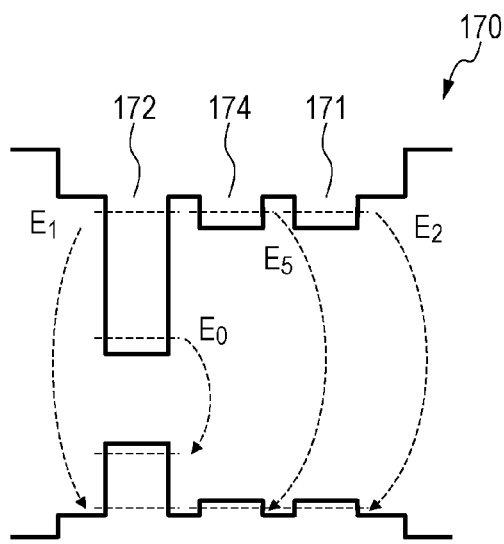

As illustrated in FIG. 3C, the third quantum well structure 174 may have a ground level of an energy level $E_5$, and the energy level $E_5$ may be substantially matched with $E_1$ and $E_2$.

The expression "energy levels $E_0$ and $E_2$ are substantially matched" herein may refer to a state that they are matched to an extent that induced amplification occurs, and the exact match therebetween is not required. The number range of energy level difference $\Delta E$ ($=E_2-E_1$) which will be described below is given for illustration purpose only and may be set to an optimum range in accordance with a width of a barrier layer width of a well layer or a depth of a well layer in a quantum well structure or other conditions. For example, when an energy level difference $\Delta E$ is preferably equal to or higher than −110 meV and equal to or lower than 25 meV and is further preferably equal to or higher than −45 meV. The absolute value of $\Delta E$ is preferably equal to or lower than 20 meV. Reasons therefore will be described below. It has been known that a gain spectrum has a certain width at a temperature around a room temperature even in a structure like a quantum dot having a Δ-function-like density of state. It is further known that the width is approximately equal to 20 meV around a room temperature. In other words, in a case where two levels exist, the gains generated from the two levels may overlap if the energy difference between photons emitted at the levels is equal to or lower than 20 meV.

The energy level difference $\Delta E$ is preferably equal to or lower than 0 meV and is further preferably equal to or lower than −21 meV. In a case where the energy level difference $\Delta E$ falls within such a range, the magnitude of the light emission intensity may be maintained even when the value of $E_2$ exceeds a designed value during a process for manufacturing the light emitting device. As the value of $\Delta E$ increases in positive direction, the light emission intensity tends to decrease rapidly, compared with a case where the value of $\Delta E$ increases in negative direction, as will be described below. If the value of $E_2$ increases in positive direction during a process for manufacturing the light emitting device, the light emission intensity decreases rapidly due to the tendency of decrease of the light emission intensity as described above. On the other hand, if the energy level difference ΔE is defined to be equal to or lower than 0 meV, the light emission intensity may be maintained high even when the value of $E_2$ increases.

According to this exemplary embodiment, because the ground level of the second quantum-confined structure is substantially matched with a high-order level corresponding to emitted light from a short wavelength band of the first quantum-confined structure, a low current injection density may be required for light emission in the short wavelength band. This mechanism will be described in detail below.

First, incorporation of a second quantum-confined structure having a ground level substantially matched with the level of emitted light having a short wavelength of a first quantum-confined structure into a quantum-confined structure may selectively increase the emitted light in the short wavelength band only.

The degree of the increase is not simply a sum of emitted light intensities. For example, two quantum-confined structures included in an active layer may have a twice or larger emission intensity in a short wavelength band than one quantum-confined structure.

Such an emission intensity equal to or more than just a sum of the light intensities may be resulted from use of induced amplification as described above and output of light due to the induced amplification through one path, unlike laser. This mechanism will be described in detail below.

Rather than an emitted light amount, the magnitude of induced amplification, that is, gain g, which is acquired when light is guided through a waveguide structure of a light emitting device changes in accordance with the number of quantum-confined structures. Assuming the light intensity with the gain g, a length L, a light confinement coefficient Γ and at a starting point of the waveguide is $P_1$, a light intensity $P_2$ after light is guided by a length L may be expressed by the following Expression (1):

$$P_2 = P_1 \times \mathrm{Exp}(\Gamma g L) \quad (1)$$

From Expression (1) above, because the gain g is within the exponential function, it should be understood that when g doubles, the magnitude of $P_2$ does not just double but is equal to or higher than the double. An SLD is applicable as a light emitting device which satisfies the relationship in Expression (1) above. For comparison, a change in emission intensity when the active layer structure as described above is used in a semiconductor laser (LD) and a light emitting diode (LED) will be examined as similar devices to the SLD.

Such an LD oscillates at a resonance wavelength of a resonator or a peak wavelength of a gain of the active layer. The oscillating light is emitted by induced amplification. The main use of induced amplification is also true in an SLD. However, in a case of the LD, even when the number of quantum-confined structures is increased, the resulting emission intensity does not increase in proportion to the number of quantum-confined structures. This is because the emitted light efficiency of an LD relates less to g and mainly depends on a product of an internal quantum efficiency(rate of carriers which internally change to photons among injected carriers) and extraction efficiency (rate of internally occurring photons extracted to outside of the resonator). It is known that the internal quantum efficiency is already a high value of 70 to 90% even in a generally known structure though the gain g has an influence on the internal quantum efficiency. Thus, even an improved quantum-confined structure may increase the internal quantum efficiency, the increased internal quantum efficiency may be 100% at a maximum. Therefore, the possibility that the effect as high as double or more may be acquired is low.

In an LED, light is generated by spontaneous emission. Thus, assuming that quantum-confined structures emit an equal amount of light, when the number of quantum-confined structures is increased, the emission intensity increases simply in proportion to the number. In other words, the total sum of emitted light intensities is acquired simply by adding intensities of emitted light from the quantum-confined structures. However, in reality, when the number of quantum-confined structures increases, the emission intensity from one quantum-confined structure tends to decrease because the injected electric current is divided by the number of quantum-confined structures. As a result, even when the number of quantum-confined structures doubles, an increase of the emitted light amount is equal to or lower than the double.

Secondly, a ground level of a second quantum-confined structure is used as a level to be substantially matched to an emission level at a short wavelength of a first quantum-confined structure. As described above, the current injection density required for acquiring an inversion distribution with a ground level is lower than the current injection density required for causing an inversion distribution with an emission level (high-order level) at a short wavelength.

An increase in electric current value required by the addition of the second quantum-confined structure is not a double but is lower than it even when two quantum-confined structures are used. In other words, in a case where a second quantum-confined structure is added to a quantum well structure including one first quantum-confined structure only, the required electric current amount may be lower than the double. On the other hand, an increase in gain due to the addition of the second quantum-confined structure may increase the emission intensity to the double or more. As described above, the emission intensity in a short wavelength band increases under an equal driving condition. In other words, a lower current injection density may be required to acquire an equal emission intensity in a short wavelength band. On the other hand, the energy level for emitting light in a short wavelength band causes light emission having a higher energy level than a ground level. Thus, light is emitted by storing carriers may be stored from a bottom in a density of state of a rectangle where carriers may exist, that is, a position having a ground level to a position with high energy having a level in a short wavelength band for light emission.

How carriers are stored to the rectangle density of state appears as a change in a spectrum generated when the amount of current injected to a light emitting device is increased. When the current injection density is low, carriers are stored around a ground level of a quantum well structure. Thus, the emission spectrum mainly shows light emission in a long wavelength band from the ground level. When the current injection density is increased from the state, carriers come to exist also at a higher energy level than the ground level. Therefore, the light emission wavelength band increases gradually to a short wavelength side, the increase appears as a peak (maximum value) on the spectrum. When the current injection density is further increased, more carriers come to exist also at a position having a higher energy level. Thus, the intensity of the emitted light at the high-order level become equal to the intensity of emitted light having a wavelength at the ground level. The driving condition for a wide spectrum (FIGS. 3A to 3C) according to NPL 1 is a state where the intensities of emitted light at the ground level (indicated as n=0 in NPL 1) and at a high-order level (n=1) are at an equal level.

In a state where carriers are stored to a high energy level, carrier recombination and an overflow from the active layer caused by spontaneous emission increases, compared with a case where light is emitted with a ground level only. In other words, in a state where carriers are stored to a high energy level, the amount of carriers consumed by induced amplification is relatively small, and the amount of those consumed by other processes is large. More increases of the current injection density may be required because of it.

Range Having Large Effects Particularly

According to the present invention, in order to increase the intensity of light emission, the ground level of a shallow quantum well may be adjusted to a given wavelength. Therefore, an arbitrary wavelength may be selected more easily.

As in NPL 1, light may basically be emitted only from a ground level and a high-order level of a quantum well by injecting carriers from a ground level to a certain energy level. However, in reality, light emission may be difficult at a high-order level largely different in energy from the ground level. This is because, as described above, when more carriers are stored (resulting in a higher carrier density), more carriers may be consumed by those excluding simulated emission.

When light emission from such a remote energy level is increased, the present invention is particularly effective. This is because light emission on a shallow side of a quantum well uses a ground level and because storage of an amount of carriers for causing simulated emission from the ground level may thus be required therefor and further carriers may not be required to store. The energy difference between the levels may fall in a standard range equal to and higher than 100 meV. For example, the emission wavelength corresponds to 60 nm or higher in a band of 850 nm. In this case, the present invention is largely effective.

The energy level for amplification may not be a level immediately above a ground level, but a further upper level (one higher order level from the ground level) may be selected instead. Because two energy levels exist under such a level, light emission by increasing a carrier density in the same quantum well may consume carriers. As a result, the intensity of the emitted light from the lower two energy levels is high. Thus, the intensity of the emitted light from the selected energy level may be low. On the other hand, because the present invention may selectively increase the intensity of the emitted light at the energy level, the intensity of the emitted light at the two upper level from the ground level is selectively increased to correct the intensity difference between the levels. Thus, light emission in a wider spectrum band may be achieved, and the present invention may be largely effective.

Under those two conditions, more specifically, if an energy difference falls within a range equal to and higher than 100 meV and if one or more levels exist between a wavelength for increasing the intensity of emitted light (=wavelength of a ground level of a shallow well) and a ground level of a deep well, the intensity increase effect of the present invention is particularly large.

Upper Electrode Layer

The upper electrode layer in the light emitting device according to this exemplary embodiment is not particularly limited but may be an electrode layer having a second p-type electrode layer containing Au on a first p-type electrode layer containing Ti. The length in a waveguide direction of the electrode may be set properly in accordance with an emission spectrum to be achieved.

Lower Electrode Layer

The lower electrode layer in the light emitting device according to this exemplary embodiment is not particularly limited but may be an electrode layer having an n-type electrode layer containing AuGe/Ni/Au.

Active Layer

A quantum well structure for the active layer in the light emitting device according to this exemplary embodiment varies in accordance with a wavelength for light emission. The emission wavelength of the quantum well structure depends on the materials of the well layer and barrier layer and the thickness of the well layer. An emission wavelength at the ground level of a quantum well structure will be mainly described below with reference to a quantum well structure for an emission wavelength in the active layer, for example.

For example, in order to acquire emitted light from a ground level within a range of 800 nm to 850 nm, a well layer containing $Al_xGa_{(1-x)}As$ having an Al composition x of 0 to 0.15 may be used. AlGaAs containing a higher Al composition than that of the well layer may be used as a barrier layer. The thickness of the quantum well layer in this case falls preferably within a range of 5 nm to 10 nm. However, because an emission wavelength depends on the thickness of the well layer and a material contained in the well layer, emitted light from a ground level within a range of 800 nm to 850 nm may be acquired by using a material having a thickness shorter than 5 nm and generating a wavelength having a smaller band gap therefor.

The material to be used is not limited to the material described above, but a light-emission material such as GaAs, GaInP, AlGaInN, AlGaInAsP, and AlGaAsSb may be used.

In order to acquire emitted light from a ground level within a range of 850 nm to 900 nm, $In_xGa_{(1-x)}As$ having an In composition x of 0 to 0.1 may be used. GaAs or AlGaAs may be used as a material of the barrier layer. The thickness of the well layer is preferably in a range of 5 nm to 10 nm. However, an emission wavelength depends on the thickness of the well layer and a material contained in the well layer. Thus, the emitted light from a ground level within a range of 850 nm to 900 nm may be acquired by using a material having a thickness shorter than 5 nm and generating a wavelength having a smaller band gap therefor.

The material is not limited thereto but any other material may be used which generates emitted light in the same wavelength band (from 800 nm to 900 nm). For example, GaInAsP may be used in the well layer to acquire a quantum well structure based on the aforementioned idea.

In the same manner, for other wavelength bands, a well layer which emit light in wavelength bands and a barrier layer containing a material having a wider band gap than it may be used and the width of the well layer may be adjusted to acquire a preferable active layer. For example, for a 980-nm band, a well layer containing InGaAs having an In composition of around 0.2 may be used. For a 1550-nm band, InGaAs having an In composition of 0.68 which lattice-matched with an InP substrate may be used.

The active layer may have a quantum-confined structure such as a quantum wire and a quantum dot, without limiting to a quantum well.

Ridge Optical Waveguide Structure

The light emitting device according to this exemplary embodiment has the ridge optical waveguide structure 105 so that light is confined within the light emitting device, is guided within the active layer and is emitted from an outgoing end face. The ridge optical waveguide structure may be formed by general semiconductor lithography and semiconductor etching. The width (w in FIG. 1B) of the ridge optical waveguide structure is not particularly limited as far as it may confine light. However, for example, the width is preferably equal to or smaller than 10 μm or is preferably equal to or smaller than 5 μm, and is further preferably equal to or smaller than 3 μm. The width or ridge width w of the ridge optical waveguide structure may be narrow so that the light emission by the light emitting device may not be switched to a multimode.

Structure of Light Outgoing End Face

In the light emitting device according to this exemplary embodiment, the ridge waveguide structure 105 is tilted in the in-plane direction of the active layer with respect to a perpendicular line of a light outgoing end face to prevent easy occurrence of laser oscillation. The tilted ridge waveguide structure may inhibit light reflected from an end face from returning to the waveguide so that laser oscillation may not easily occur. For example, the ridge waveguide structure may be tilted in the in-plane direction of the active layer with respect to a perpendicular line of an outgoing end face by about 7°. In order to inhibit reflection from an end face, a dielectric film of SiN, for example, may be provided as an antireflection coating. The antireflection coating may be provided on one or both of an outgoing end face $P_1$ and an end face $P_2$ opposite against it. In order to inhibit degradation on an outgoing end face, a region to which electric current is not injected may be provided near the outgoing end face.

Control Unit

The control unit according to this exemplary embodiment is not particularly limited as far as it may control the injection density of current to be injected to each electrode. The current injection density may be determined based on information on the intensity of light detected by the emitted light detection unit transmitted to the control unit by using a feedback circuit. One or a plurality of control units may be provided in this exemplary embodiment. In a case where a plurality of control units are provided, a control unit may be provided for each of divided electrodes, or it may be configured such that one control unit may control the injection amount of electric current to a plurality of electrodes. In a case where two control units are provided, for example, one may control a first electrode 111 on the outgoing end face $P_1$ side and an adjustment electrode 112 and the other may control a second electrode 113 on the end face $P_2$ side.

Manufacturing Method

The manufacturing method for the light emitting device according to this exemplary embodiment is not particularly limited but may be manufactured by causing semiconductor layers to sequentially grow by using Metal Organic Chemical Vapor Deposition (MOCVD).

Second Exemplary Embodiment

Figure 4:
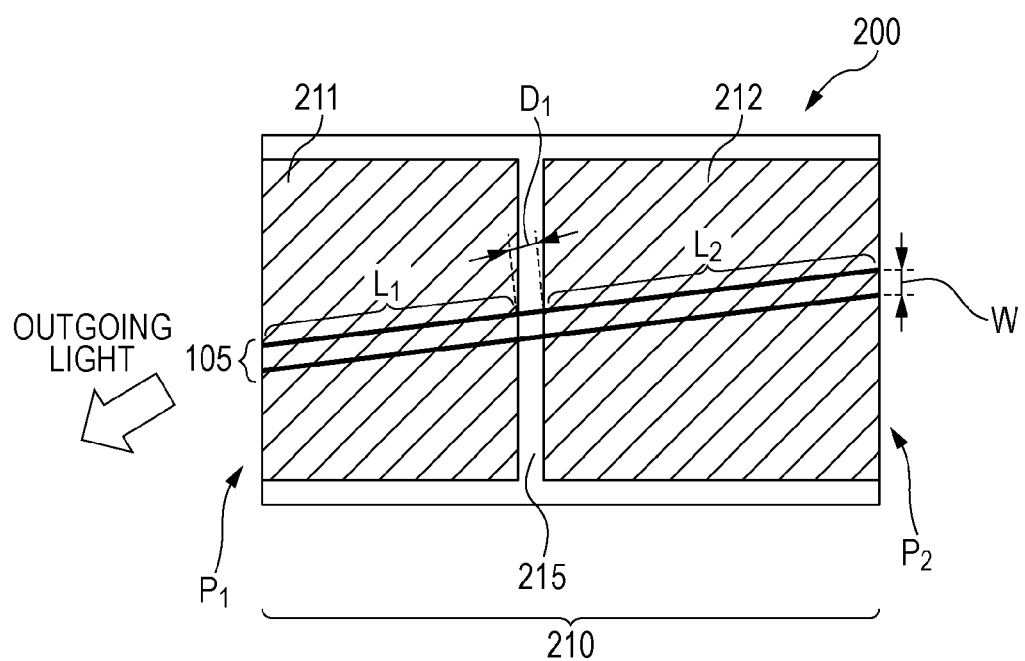
FIG. 4 is a diagram for explaining a configuration of a light emitting device according to a second exemplary embodiment of the present invention.

A light emitting device according to a second exemplary embodiment will be described with reference to FIG. 4. FIG. 4 is a top view of a light emitting device according to this exemplary embodiment. This exemplary embodiment has an active layer structure similar to that of the first exemplary embodiment but is different from the first exemplary embodiment in that a distribution of a current injection is provided in a light waveguide direction. Such a distribution of current injection density allows more free control of a shape of an emission spectrum, compared with a case where electric current is injected uniformly to a whole. Differences from the first exemplary embodiment will be described below, and the description on the same parts will be omitted.

The configuration of components in the light emitting device 200 according to this exemplary embodiment is the same as that of the first exemplary embodiment except that the upper electrode layer 210 is divided into a plurality of electrodes. According to this exemplary embodiment, the upper electrode layer 210 has a first electrode 211(front electrode) provided on an outgoing end face $P_1$ side and a second electrode 212 (rear electrode) provided on an end face $P_2$ opposite against the outgoing end face $P_1$. The current injection densities to the first electrode 211 and the second electrode 212 may be adjusted properly so that the size and intensity of a wavelength band of emitted light, that is, the shape of an emission spectrum may be changed. In this case, the control unit 150 may be connected to the first electrode 211 and second electrode 212 so that the current injection densities to the electrodes may be individually adjusted. For example, the current injection density to the first electrode 211 may be increased to allow light emission in a short wavelength band. The current injection density to the second electrode 212 may be reduced to allow light emission in a long wavelength band. Both of an emission spectrum in a short wavelength band and emitted light in a long wavelength band may be multiplexed to acquire an emission spectrum in a wide wavelength band. Though emitted light in a long wavelength band from the second electrode 212 has a low intensity, induced amplification occurs when the light passes through an active layer region corresponding to the first electrode 211. As a result, an emission spectrum having a sufficient emission intensity in a wavelength band from a short wavelength to a long wavelength generated by the light emitting device 200. The emission spectrum may have a Gaussian shape. To acquire the shape, the current injection density to the electrodes may be adjusted properly. Having described above the configuration in which the upper electrode layer 210 is divided into two electrodes, it may be divided into three or more electrodes. Further having described the configuration in which the upper electrode layer 210 is divided, the lower electrode layer 120 may be divided into a plurality of electrodes. Both of the upper electrode layer 210 and lower electrode layer 120 may be divided. The length $L_1$ in a waveguide direction of the first electrode 211 and the length $L_2$ in a waveguide direction of the second electrode 212 may be defined properly in accordance with an emission spectrum to be emitted.

The length $D_1$ in a waveguide direction of an electrode division region 215 between the first electrode 211 and the second electrode 212 is preferably equal to or shorter than 20 μm and is further preferably equal to or shorter than 10 μm.

Third Exemplary Embodiment

A light emitting device according to a third exemplary embodiment will be described with reference to FIG. 5. According to this exemplary embodiment, a distribution of current injection density is provided in a light waveguide direction like the second exemplary embodiment, but an active layer region to which electric current is hardly fed, that is, an active layer region(absorption region) where absorption by a band gap is dominant. A light emission region exists before and after the absorption region, and light emitted from the light emission region after the absorption region is influenced by absorption when it passes through the region where the absorption is dominant. Because the absorption has wavelength dependency, the shape of the spectrum of the light after passing through it may be controlled. As a result, the spectrum shape may be control more freely than the second exemplary embodiment. Differences from the first and second exemplary embodiments will be described, and the repetitive descriptions will be omitted.

A light emitting device 300 according to this exemplary embodiment has an upper electrode layer 310 divided into four electrodes of a first electrode 311, a second electrode 312, a third electrode 313, and a fourth electrode 314. In other words, the light emitting device of this embodiment further includes two electrodes 313 and 314 on the end face $P_2$ side, compared with the second electrode 212 in the light emitting device according to the second exemplary embodiment of the present invention. The current injection densities to those four electrodes may be adjusted properly to achieve an emission spectrum in a wide wavelength band. For example, the current injection density to the first electrode 311 may be adjusted higher than the current injection density to the second electrode 312, and the current injection density to the fourth electrode 314 may be adjusted higher than the current injection density to the second electrode 312. The current injection density to the third electrode 313 may be adjusted to zero. Under this electric current injection condition, an emission spectrum generated by the first electrode 311 appears in a short wavelength band (center wavelength $\lambda_1$), and the emission spectrum generated by the second electrode 312 has a center wavelength having a longer wavelength $\lambda_2$ than $\lambda_1$. Furthermore, the emission spectrum generated by the fourth electrode 314 has a center wavelength having a longer wavelength $\lambda_4$ than $\lambda_2$. However, a short wavelength band of the emission spectrum is only absorbed when it passes through an active layer region (absorption region) corresponding to the third electrode. As a result, emission spectrums from active layer regions corresponding to the first electrode 311, second electrode 312, and fourth electrode 314 are multiplexed, and light in a wide wavelength band is emitted from the light emitting device 300. In this manner, providing an absorption region in which a certain wavelength band is absorbed allows further detail control of a shape of an emission spectrum than the light emitting device according to the second exemplary embodiment. It should be noted that reverse-biased electric current may be injected to such an absorption region so that the emission spectrum may be adjusted to a desired shape.

The active layer region corresponding to each of the electrodes is an active layer region immediately under a region to which electric current is injected in the electrode. Referring to FIGS. 1A to 1C, the active layer region is positioned immediately under a surface with which the electrode layer 110 and the contact layer 106 are in contact.

Fourth Exemplary Embodiment

Optical Coherence Tomography Device

According to a fourth exemplary embodiment, a light emitting device according to any one of the first to third exemplary embodiments and an optical coherence tomography device(OCT) having a light source system including a light emitting device will be described with reference to FIG. 6.

An OCT 400 according to this exemplary embodiment at least includes a light emitting device (light source system) 401, a coherent optical system 402, a spectroscope 403, a coherent light detection unit 404, and an information acquisition unit 405, and the light source system 401 may be a light emitting device (light source system) according to any one of the first to fourth exemplary embodiments.

In the coherent optical system 402, light from the light emitting device (light source system) 401 is demultiplexed to irradiation light to be irradiated to an object 410 and reference light, and reflected light of the light irradiated to the object 410 and coherent light generated by the reference light occur. The coherent light has information on the object 410 to be measured. The coherent light separated by the spectroscope 403 is received in a manner that light beams having different wavelengths are irradiated to different positions of the coherent light detection unit 404. The information acquisition unit 405 acquires information on the object 410, such as information on a tomogram from information on the intensity of light received by the coherent light detection unit 404. Next, a detail configuration of the OCT according to this exemplary embodiment will be described with reference to FIG. 6.

Figure 6:
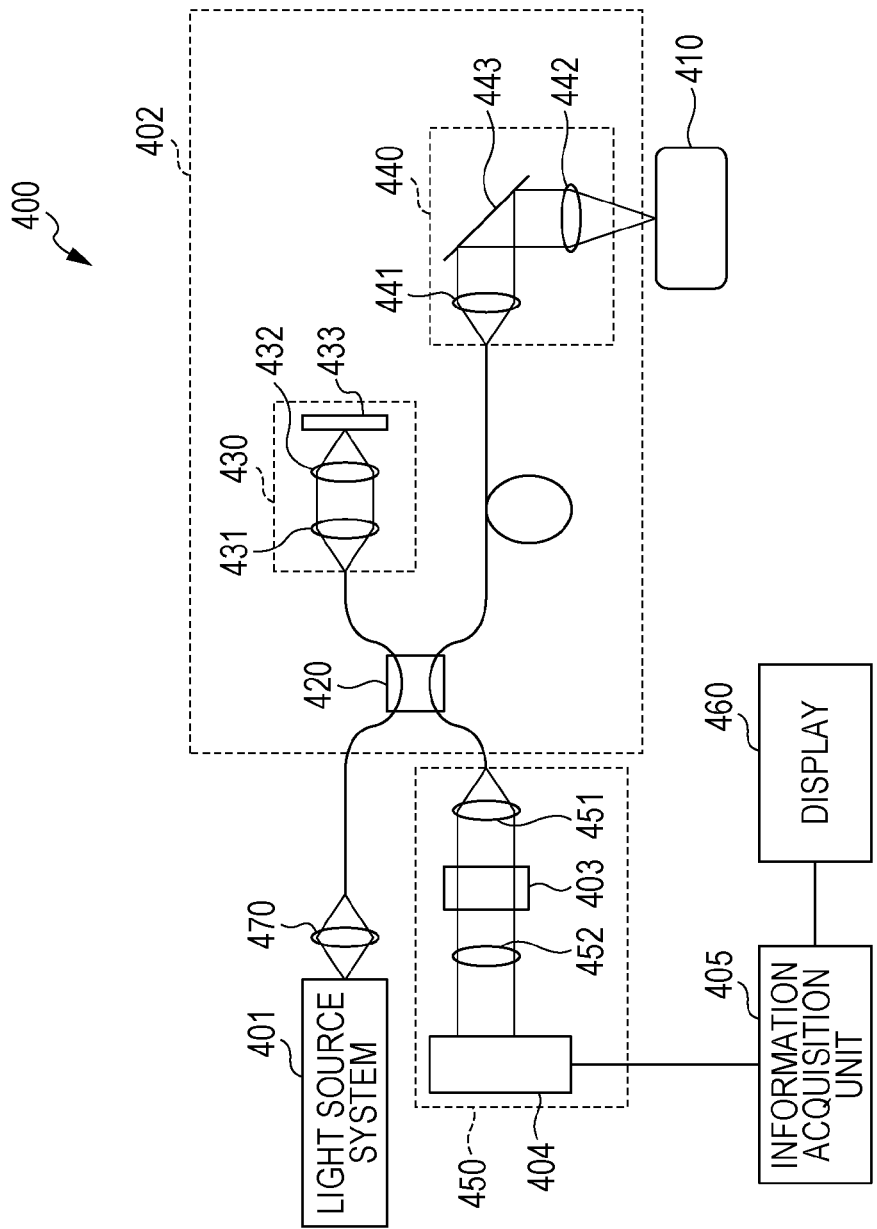
FIG. 6 is a diagram for explaining a configuration of an OCT according to a fourth exemplary embodiment of the present invention.

In the OCT illustrated in FIG. 6, light emitted from the light emitting device (light source system) 401 is demultiplexed into irradiation light and reference light by the demultiplexing unit 420 in the coherent optical system 402. The irradiation light becomes reflected light acquired by being reflected by the object 410 to be measured through an irradiation optical system 440, and reference light reflected by a reference optical system 430 and coherent light from the interference unit (demultiplexing unit) 420 occur. The OCT according to this exemplary embodiment includes a light detection optical system 450 which detects coherent light occurring in the interference unit 420, an information acquisition unit 405 which acquires information regarding a tomogram based on light detected by the light detection optical system 450, and a display unit 460 which displays a tomogram.

Light from the light emitting device (light source system) 401 passes through an optical fiber and is demultiplexed into reference light and irradiation light by the demultiplexing unit (interference unit) 420, and a part of the demultiplexed light enters to the reference optical system 430. In this case, the demultiplexing unit 420 and the interference unit 420 may use an identical fiber coupler. The reference optical system 430 includes collimator lenses 431 and 432 and a reflector 433, and reference light reflected by the reflector 433 enters to the optical fiber again. The irradiation light which is the other light demultiplexed by the demultiplexing unit 420 from the optical fiber enters to the irradiation optical system 440. The irradiation optical system 440 includes collimator lenses 441 and 442 and a reflector 443 which bends an optical path by 90°. The irradiation optical system 440 may cause the entering light to enter to the object 410 to be measured and bond reflected light to the optical fiber again.

The light returning from the reference optical system 430 and irradiation optical system 440 passes through the interference unit 420 and enters to the light detection optical system 450. The light detection optical system 450 has collimator lenses 451 and 452 and a diffraction grating 403 functioning as a spectroscope. The light detection optical system 450 further has a line sensor 404 for acquiring spectrum information of light separated by the diffraction grating 403. In the OCT according to this exemplary embodiment, the reference optical system 430 has the reflector 433, and light reflected by the reflector 433 returns to the interference unit 420. However, without the reflector 433, light may pass through an optical path having an appropriate optical path length and may reach the interference unit 420. The OCT according to this exemplary embodiment is useful for acquiring a tomogram of a living body of an animal or a human in fields including ophthalmology, dentistry, and dermatology. The information regarding a tomogram of a living body may include not only a tomogram of a living body but also numerical data required for acquiring a tomogram. Particularly, the OCT according to this exemplary embodiment may be used for acquiring information regarding a tomogram of the eye ground of a human body which is defined as a measurement subject. The OCT may be called an OCT apparatus.

Other Applications

In addition to the OCT, the light emitting device according to an exemplary embodiment of the present invention may be used as a light source for optical communication and a light source for optical measurement.

EXAMPLES

Examples of the present invention will be described below. An active layer structure and a layer structure according to the following examples are given for illustration purpose only and are not intended to limit them. The dimensions of components of a light emitting device, steps for manufacturing, devices and parameters according to a manufacturing method for the light emitting device are not limited by the examples. Semiconductor materials, electrode materials, dielectric materials and so on are not limited to those disclosed in the examples. The conductivity types of semiconductor layers are not limited to those illustrated according to the examples, and one illustrated as a p-type and one illustrated as an n-type may be replaced by an n-type and a p-type, respectively.

First Example

A light emitting device according to a first example of the present invention will be described. FIGS. 1A to 1C illustrate a configuration of a light emitting device 100 according to this example. In this example, a GaAs substrate 101 as a substrate, an n-type $Al_{0.5}GaAs$ clad layer 102 as a lower clad layer, an active layer 103, and a p-type $Al_{0.5}GaAs$ clad layer 104 as an upper clad layer are used. A p-type GaAs contact layer 106 is used as a contact layer, and a p-type electrode 110 is used as an upper electrode layer above the contact layer 106. An n-type electrode 120 is used as a lower electrode layer. As illustrated in FIGS. 1A to 1C, a ridge optical waveguide structure 105 is provided. The ridge optical waveguide structure 105 has a width of 3 um such that outgoing light has a single mode. The perpendicular line of the outgoing end face and the angle of the light guide are tilted by about 7° to prevent reflection on the end face $P_1$ of the ridge optical waveguide structure 105.

Figure 7A:
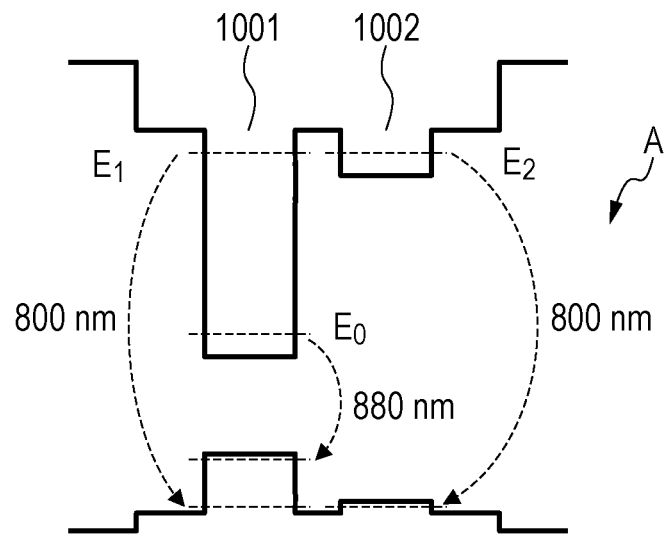
FIG. 7A is band diagram of a quantum well structure in the light emitting device according to a first example of the present invention.

Next, details of a quantum well structure of the active layer 103 according to this example will be described with reference to a band diagram (FIG. 7A). The active layer according to this example has a quantum well structure A including two quantum well structures (FIG. 7A). A first quantum well structure 1001 has an $Al_{0.2}GaAs$ guide layer, a well layer having 8 nm thick $In_{0.07}GaAs$ layer and 10 nm thick $Al_{0.2}GaAs$ barrier layer which sandwich it. A second quantum well structure 1002 is a structure acquired by sequentially laminating a 10 nm thick $Al_{0.2}GaAs$ barrier layer, a well layer including a 6 nm thick $Al_{0.03}GaAs$ layer, and an $Al_{0.2}GaAs$ guide layer. The first quantum well structure and the second quantum well structure shares the 10 nm thick $Al_{0.2}GaAs$ barrier layer.

In the quantum well structures, a primary level $E_1$ of the first quantum well structure 1001 ($In_{0.07}GaAs/Al_{0.2}GaAs$) and a ground level $E_2$ of the second quantum well structure 1002 ($Al_{0.03}GaAs/Al_{0.2}GaAs$) are substantially matched. Regarding emission wavelengths for levels of the quantum well structure A, the emission wavelength for the ground level $E_0$ is about 880 nm and the emission wavelength for the primary level $E_1$ is about 800 nm in the first quantum well structure 1001, and the emission wavelength for the ground level $E_2$ in the first quantum well structure 1002 is about 800 nm. In other words, the wavelength (nm) attached to the broken arrows in FIG. 10A a wavelength of emitted light generated by a recombination of electrons having an energy level at the starting point of each of the arrows and holes having an energy level at the end point. For example, the emitted light from the primary level $E_1$ in the first quantum well structure has a wavelength of 800 nm. The same is true for band diagrams referred in the following examples.

Figure 7B:
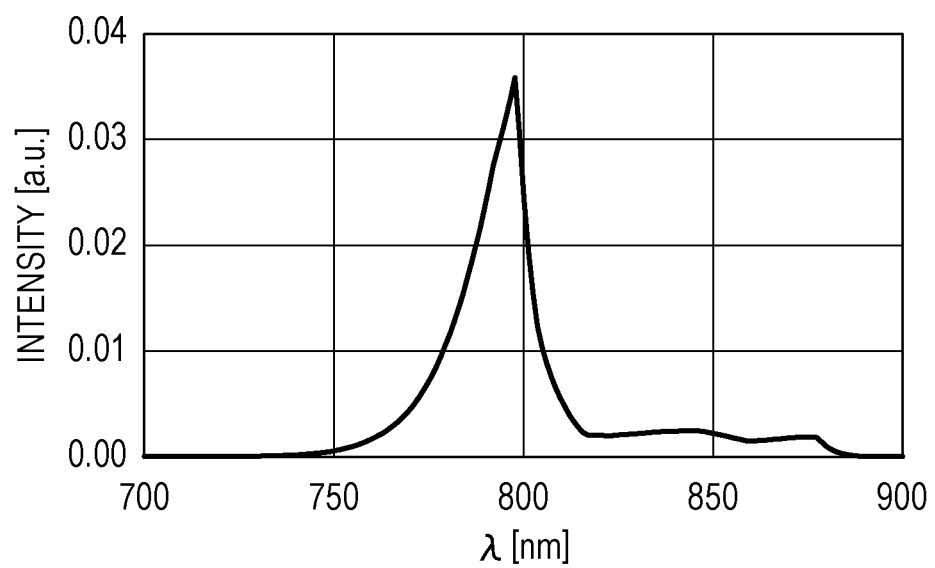
FIG. 7B is a graph showing a calculation result of an emission spectrum in the light emitting device according to a first example of the present invention.

FIG. 7B illustrates a calculation result of an emission spectrum of emitted light generated by injection of 60 mA electric current in the light emitting device according to the first example. The emission spectrum from the ground level $E_0$ in the first quantum well structure 1001 has a center around 880 nm. The emission spectrum from the primary level $E_1$ of the first quantum well structure 1001 and the ground level $E_2$ in the second quantum well structure 1002 has a center around 800 nm, from which it is understood that the emitted light from these levels is high.

According to this example, in order to increase the intensity of the emitted light having a primary level in the first quantum well structure 1001, the ground level of the second quantum well structure 1002 is substantially matched with the primary level of the first quantum well structure 1001. In order to acquire a relatively high emission intensity in a short wavelength band, a high current injection density may be required. Therefore, use of the quantum well structure designed as in this example allows acquisition of light having a relatively high emission intensity in a short wavelength band even when a current injection density is low, from which the extended life of the light emitting device may be expected.

First Comparative Example

A comparative example of the light emitting device according to the first example will be described. The configuration according to this comparative example is the same as the first example except for its quantum well structures. Two quantum well structures B and C are provided according to this comparative example.

Figure 8A:
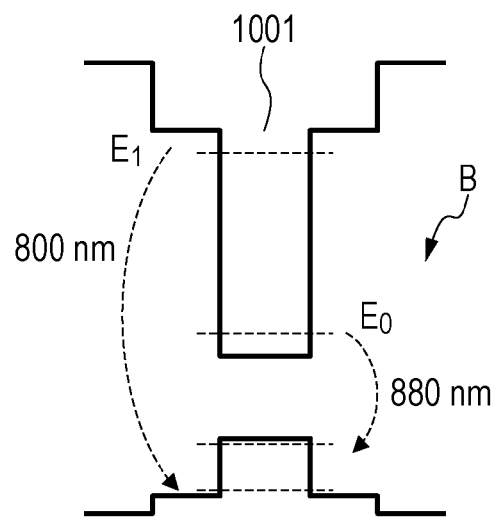
FIGS. 8A and 8B are band diagrams of a quantum well structure in a light emitting device according to a first comparative example of the present invention.

The quantum well structure B is, as illustrated in FIG. 8A, a single quantum well structure having one quantum well structure which is the same as the first quantum well structure 1001 of the quantum well structure A.

Figure 8B:
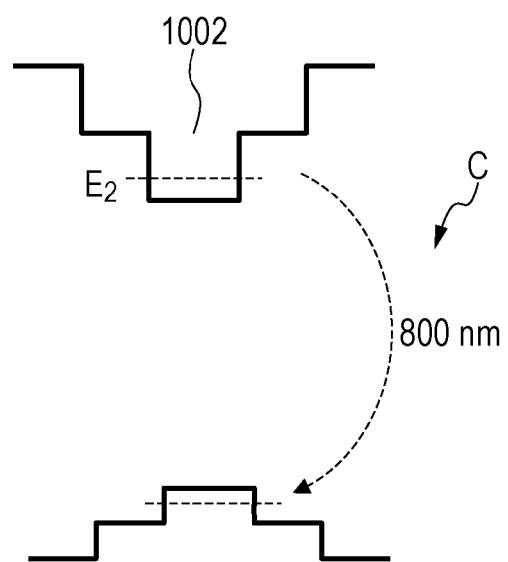

The quantum well structure C is, as illustrated in FIG. 8B, a single quantum well structure having one quantum well structure which is the same as the second quantum well structure 1002 of the quantum well structure A.

Figure 9A:
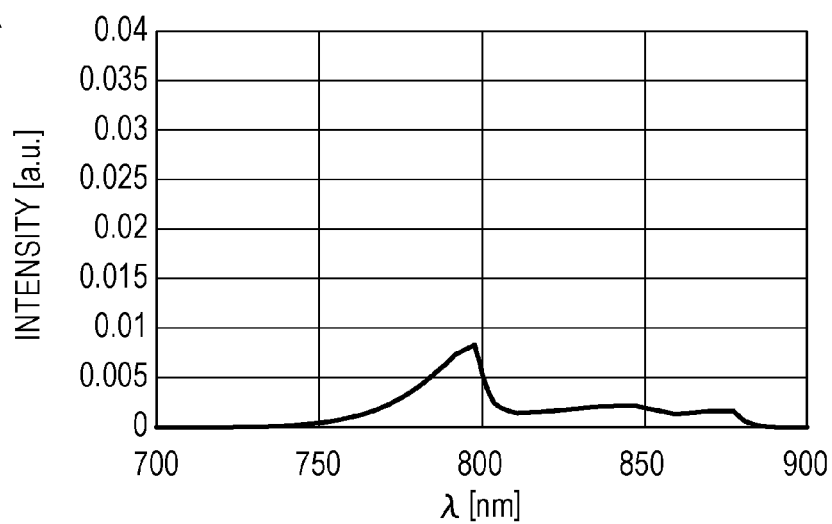
FIGS. 9A to 9C are graphs showing an emission spectrum in the light emitting device according to the first comparative example of the present invention.
Figure 9B:
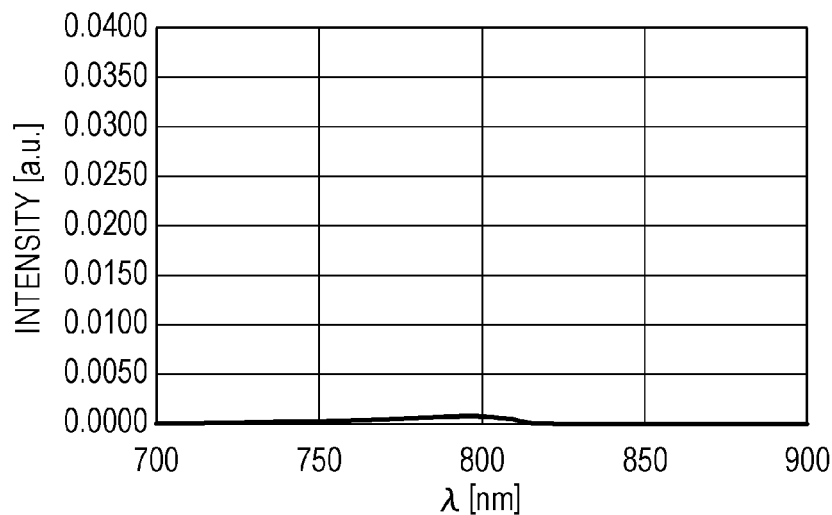
Figure 9C:
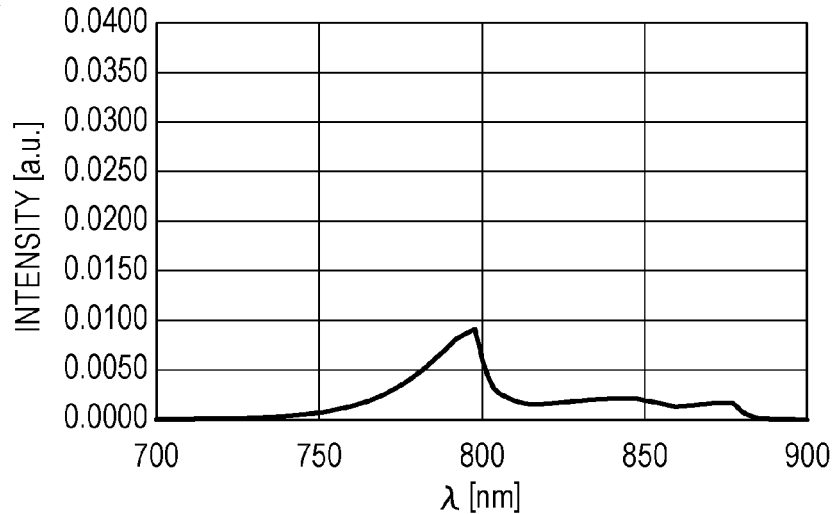

FIGS. 9A and 9B illustrate calculation results of emission spectrums acquired when electric current is injected with an equal current injection density to that of the first example to the quantum well structures B, C. FIG. 9C illustrates an emission spectrum acquired by adding the emission spectrums in FIG. 9A and FIG. 9B.

Comparing peak intensities at an wavelength of about 800 nm which is an emission wavelength from the primary level of the first quantum well structure 1001 in FIG. 7B and FIG. 9C, FIG. 9C has an intensity about 2.9 times of the intensity in FIG. 7B. From this, it is understood that when a plurality of quantum well structures are included in the active layer, an emission intensity equal to or higher than the intensity of the spectrum acquired by simply adding the emission spectrums of the active layers of single quantum well structures.

Second Example

A light emitting device according to a second example of the present invention will be described. A light emitting device according to this example has an active layer structure (hereinafter, called a quantum well structure D) including two quantum well structures equivalent to the first quantum well structure 1001 in the quantum well structure A of the light emitting device according to the first example. Differences from the first example will only be described below, and the descriptions on common matters will be omitted.

Figure 10A:
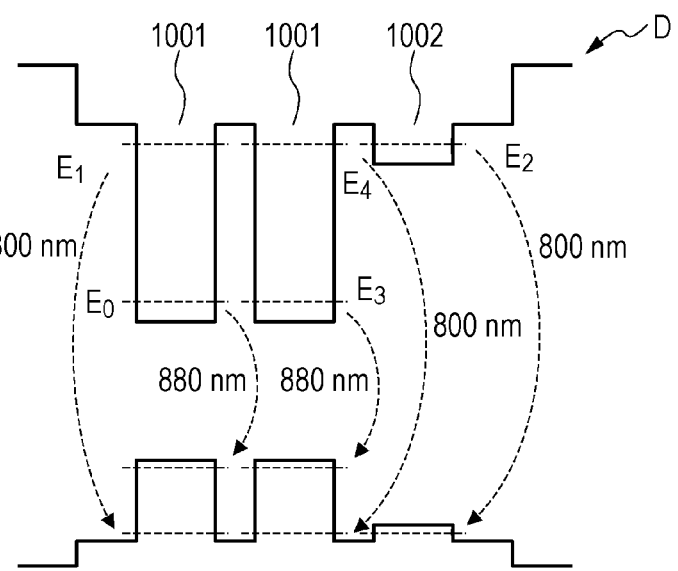
FIG. 10A is a band diagram of a quantum well structure in the light emitting device according to a second example of the present invention.
Figure 10B:
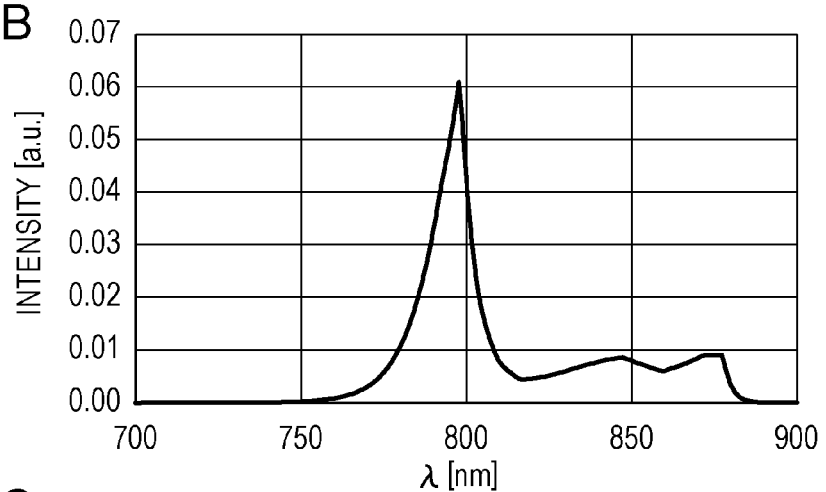
FIGS. 10B and 10C are graphs showing a calculation result of an emission spectrum in the light emitting device according to a second example of the present invention.
Figure 10C:
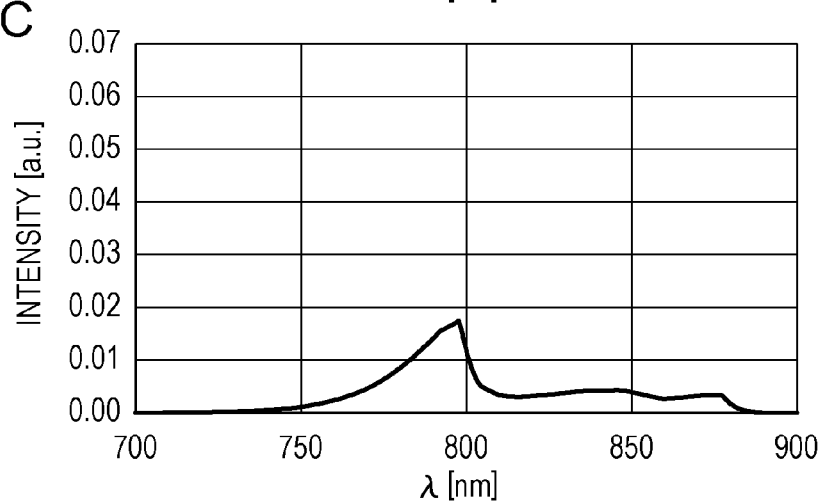

The quantum well structure D of this example has a total of three quantum well structures including two first quantum well structures 1001 and one second quantum well structure 1002 (FIG. 10A). A primary level of the first quantum well structure 1001 is substantially matched with a ground level of the second quantum well structure 1002. FIG. 10B illustrates a calculation result of an emission spectrum acquired when electric current is injected with an equal current injection density to those of the first example and comparative example to the active layer having the quantum well structure D. FIG. 10C illustrates a calculation result acquired by multiplexing emission spectrums from the active layer having the three quantum well structures 1001, 1001, and 1002 of the quantum well structure D as a single quantum well structure.

Comparing the peak intensities at a wavelength of about 800 nm in the emission spectrums in FIG. 10B and FIG. 10C, the intensity in FIG. 10B is about 3.4 times of the intensity in FIG. 10C.

Third Example

A light emitting device according to a third example of the present invention will be described. A light emitting device according to this example has an active layer structure (hereinafter, called an active layer structure E) having an equivalent quantum well structure to the second quantum well structure 1002 used in the first example in addition to the quantum well structure A. Differences from the first example will only be described, and the descriptions on common matters will be omitted.

Figure 11A:
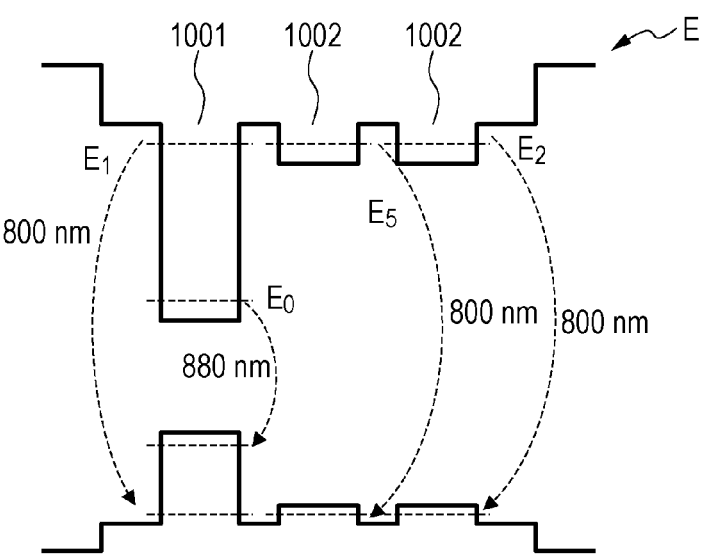
FIG. 11A is a band diagram of a quantum well structure in the light emitting device according to a third example of the present invention and, FIGS. 11B and 11C are graphs showing a calculation result of emission spectrum in the light emitting device according to a third example of the present invention.
Figure 11B:
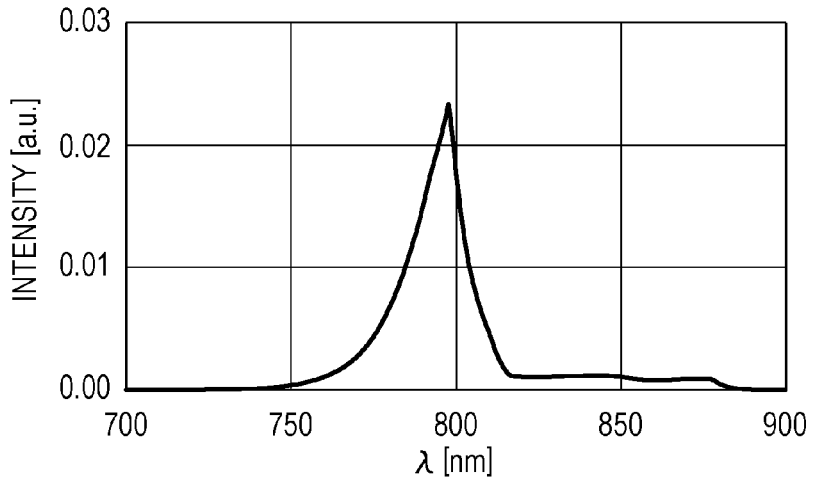
Figure 11C:
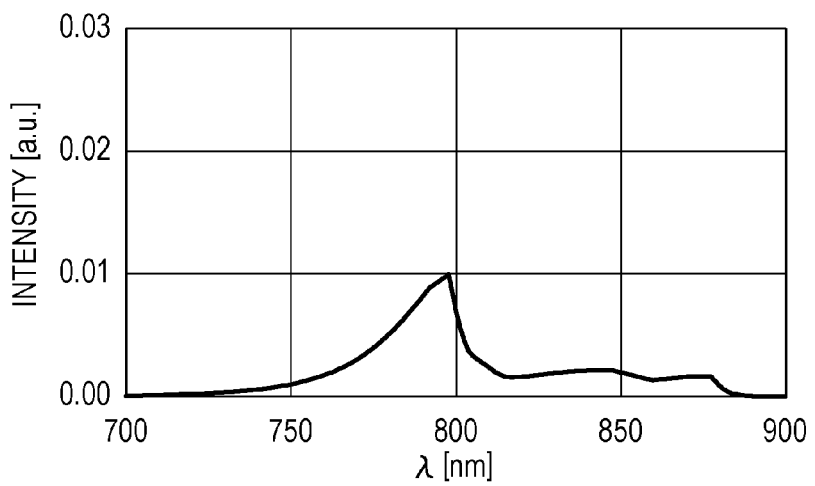

FIG. 11A illustrates a band diagram of a quantum well structure E according to this exemplary embodiment. The quantum layer structure E is a triple quantum well structure having a total of three quantum well structures including one first quantum well structure 1001 and two second quantum well structures 1002. FIG. 11B illustrates a calculation result of an emission spectrum acquired when electric current is injected with an equal current injection density to those of the first and second examples and the comparative example to the active layer having the quantum well structures according to this example. FIG. 11C illustrates a calculation result acquired by multiplexing emission spectrums from the active layer having the three quantum well structures 1001, 1002, and 1002 of the quantum well structure E as a single quantum well structure. Comparing the peak intensities at a wavelength of about 800 nm, which is an emission wavelength of the primary level in the first quantum well structure 1001, in the emission spectrums in FIG. 11B and FIG. 11C, the intensity in FIG. 11B is about 2.3 times of the intensity in FIG. 11C.

Fourth Example

A light emitting device according to a fourth example of the present invention will be described with reference to FIG. 4. The light emitting device according to the fourth example of the present invention has an identical configuration to that of the first example except that the upper electrode layer is divided into two and that the active layer has a different composition. Differences from the first example will only be described below, and the descriptions on common matters will be omitted.

An upper electrode layer 210 of the light emitting device according to this example is divided into a first electrode 211 and a second electrode 212, and a ridge waveguide structure 105 is provided. The first electrode 211 and the second electrode 212 are electrically divided, and an electrode division region 215 has a higher electrical resistance value. Here, the expression "high electrical resistance value" refers to a state that an electrical resistance value between the first electrode 211 and the second electrode 212 is ten times or more of series resistance of the first electrode 211 and the lower electrode layer 120. Regarding lengths in a waveguide direction of the electrodes, the first electrode 211 has a length $L_1$ of 0.29 mm, and the second electrode 212 has a length $L_2$ of 0.3 mm. Light is emitted from an end face (cleavage plane) $P_1$ with which the electrode 211 is in contact. The active layer in the light emitting device according to this example has a double quantum well structure having a first quantum well structure including 8 nm thick $In_{0.08}GaAs$ layer as a well layer and a second quantum well structure having a 6 nm thick GaAs layer as a well layer. Barrier layers which sandwich the well layers are both $Al_{0.2}GaAs$ layers. Crystal growth is performed by MOCVD method such that a primary level of the first quantum well structure($In_{0.08}GaAs/Al_{0.2}GaAs$) and a ground level of the second quantum well structure($GaAs/Al_{0.2}GaAs$) may be substantially match in the quantum well structures to thus produce a semiconductor laminate. According to this example, because emission wavelengths, or energy levels, of the ground level of the second quantum well structure and the primary level of the first quantum well structure are substantially matched, the same effect as the effect according to the first example may be acquired.

Figure 12A:
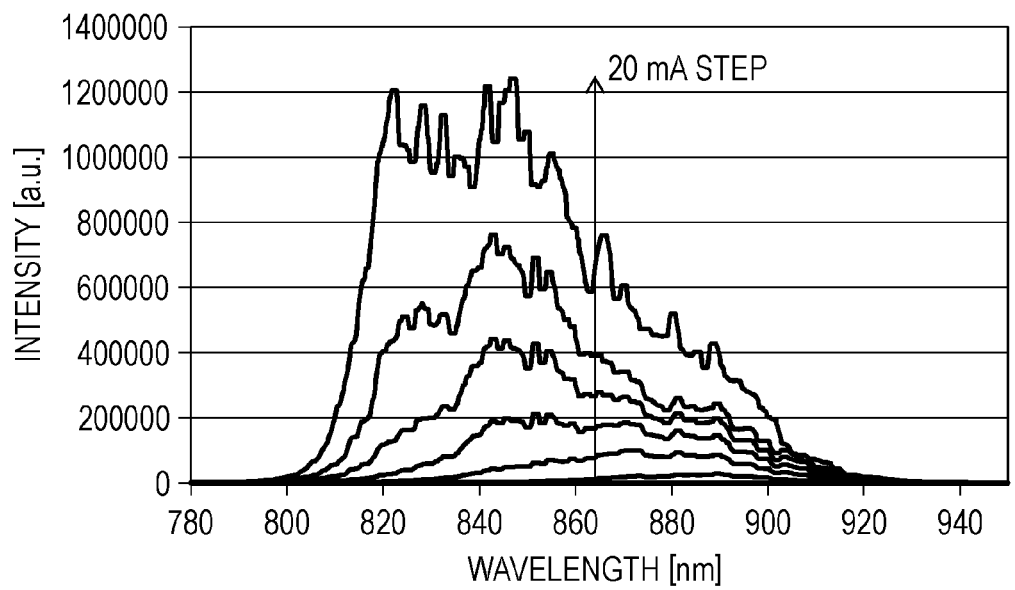
FIGS. 12A and 12B are graphs showing an actual measurement result of an emission spectrum of the light emitting device according to a fourth example of the present invention.
Figure 12B:
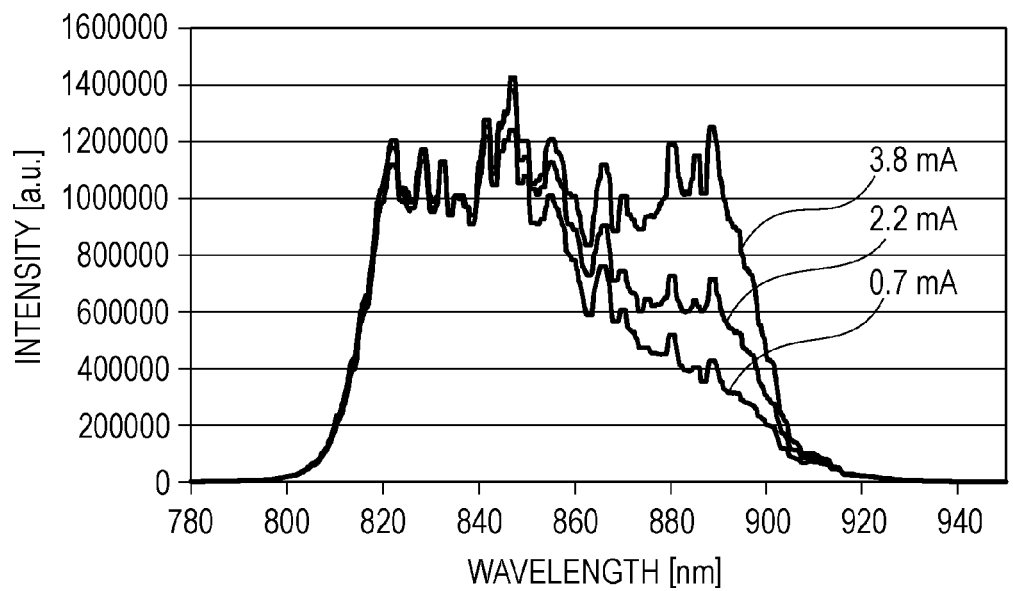

FIGS. 12A and 12B illustrate experiment results of an emission spectrum acquired by injecting electric current to the light emitting device according to this example. FIG. 12A is a graph showing an experiment result of changes in emission spectrum when electric current is injected in steps of 20 mA from 0 mA to 120 mA to the first electrode 211 only. The graph illustrates that a peak wavelength shifts from a long wavelength band to a short wavelength band as the injection amount of electric current increases. The shift of a peak wavelength is resulted from a change in a gain spectrum due to carrier storage from a ground level to a high-order level within a quantum well structure, as disclosed in NPL 1.

FIG. 12B illustrates an experiment result of a change in an emission spectrum when the amount of current to be injected to the second electrode 212 is increased in a state that 120 mA electric current is injected to the first electrode 211. The graph illustrated in FIG. 12B illustrates that the emission intensity in the long wavelength band increases selectively. When the injected electric current value is 3.8 mA, the emission spectrum is the widest.

In the emission spectrum illustrated in FIG. 12A when electric current is injected to one electrode only, the emission spectrum is the widest an electric current of 120 mA.

On the other hand, as illustrated in FIG. 12B, the condition where the spectrum is the widest due to injection of electric current to two electrodes is that the electric current injected to the first electrode 211 is 120 mA, and the electric current injected to the second electrode 212 is 3.8 mA. From these results, it is understood that when a plurality of divided electrodes are used according to this example, the optical output intensity may be increased and at the same time the width of the emission spectrum may be increased.

Next, a driving condition for emission spectrum control in the light emitting device in which the upper electrode layer is divided into two according to this example will be examined in detail.

The current injection density to the first electrode 211 is 32 times of the current injection density to the second electrode 212.

Two reasons below may be considered for requiring a higher current injection density to the first electrode 211 than an electric current density to the second electrode 212. A first reason is because the driving with an electric current density may be required such that the wavelength of an emitted light peak in the first electrode 211 may be shorter than the wavelength of an emitted light peak in the second electrode 212. As illustrated in FIG. 12B, the wavelength band which allows an increase of an emission intensity by injection of electric current to the second electrode 212 is mainly on the long wavelength side from the center wavelength (860 nm in FIG. 12B) of the light emission wavelength band. In other words, the wavelength band in which the emission intensity is to be increased by injection of electric current to the first electrode 211 is on the short wavelength side from the center wavelength. Therefore, the emitted light in a short wavelength band due to electric current having a high intensity injected to the first electrode 211 and emitted light in a long wavelength band due to injection of electric current injected to the second electrode 212 may be multiplexed so that the emission spectrum from the light emitting device may have a wide wavelength band.

The second reason is because induced amplification is required in an active layer region corresponding to the first electrode 211. According to this example, the current injection density to the second electrode 212 is a current injection density which does not reach a transparent carrier density in an active layer corresponding to the second electrode 212. Thus, because a most part of emitted light in a short wavelength band from the light emitting device according to this example is light acquired by induced amplification in the first electrode 211, the first electrode 211 is required to be driven with an electric current density enough for causing the induced amplification. The driving condition for the second electrode 212 according to this example may provide the effect even with a low electric current density which does not cause induced amplification. This is because generation of seed light for causing induced amplification in the first electrode 211 is only required. The light emission in a long wavelength band may occur even with a lower current injection density.

FIG. 12B illustrates that when 3.8 mA electric current is injected to the second electrode 211, the light intensity increases to an equivalent level to that of emitted light having a short wavelength from the first electrode 211. This is considered that it is because emitted light from the second electrode 212 enters to the active layer region corresponding to the first electrode 211, and the light undergoes induced amplification in the first electrode 211. Therefore, though the second electrode 212 may be required to emit light having a predetermined wavelength, the emission intensity is not required as high as that from the first electrode 211.

The current injection density to the second electrode 212 is preferably a current injection density equal to or lower than 50% of the current injection density to the first electrode 211. This is because, As described above, when the current injection density increases, a peak of the emission wavelength shifts to a short wavelength side, and, therefore, the emission intensity in a short wavelength band is higher than that in a long wavelength band, and the half-width of the emission spectrum is reduced.

On the other hand, because the emission intensity from the second electrode 212 is not required to be as high as the emission intensity from the first electrode 211, it is effective even with a current injection density ratio of ten or more time.

The effect may be achieved even by injecting electric current of a current injection density which does not cause induced amplification to the second electrode 212 according to this exemplary embodiment. A level (emitted light from ground level light holes of the first quantum well) of 850 nm exists, as illustrated in FIGS. 12A and 12B, between a level near 890 nm of the first quantum well structure and a ground level of 825 nm of the second quantum well, which are to be amplified according to this example. In other words, another level exists between a ground level (more strictly, emitted light from ground level heavy holes) and a level of 825 nm which increases the intensity of emitted light. The wavelength difference between 890 nm and 825 nm is 65 nm. Thus, it is understood that the configuration of this example is included in a range where the effect of the present invention as described with reference to the exemplary embodiments are particularly significant. The three levels with an equal emission intensity may allow light emission in a wide wavelength band over 80 nm without a large dip (in an emission spectrum) where the intensity is close to 0.

Fifth Example

A light emitting device according to a fifth example of the present invention will be described with reference to FIG. 5. The light emitting device according to the fifth example according to the present invention has an identical configuration to that of the fourth example except for that the upper electrode layer is divided into four. Differences from the first and fourth examples will only be described below, and the descriptions on common matters will be omitted.

Figure 5:
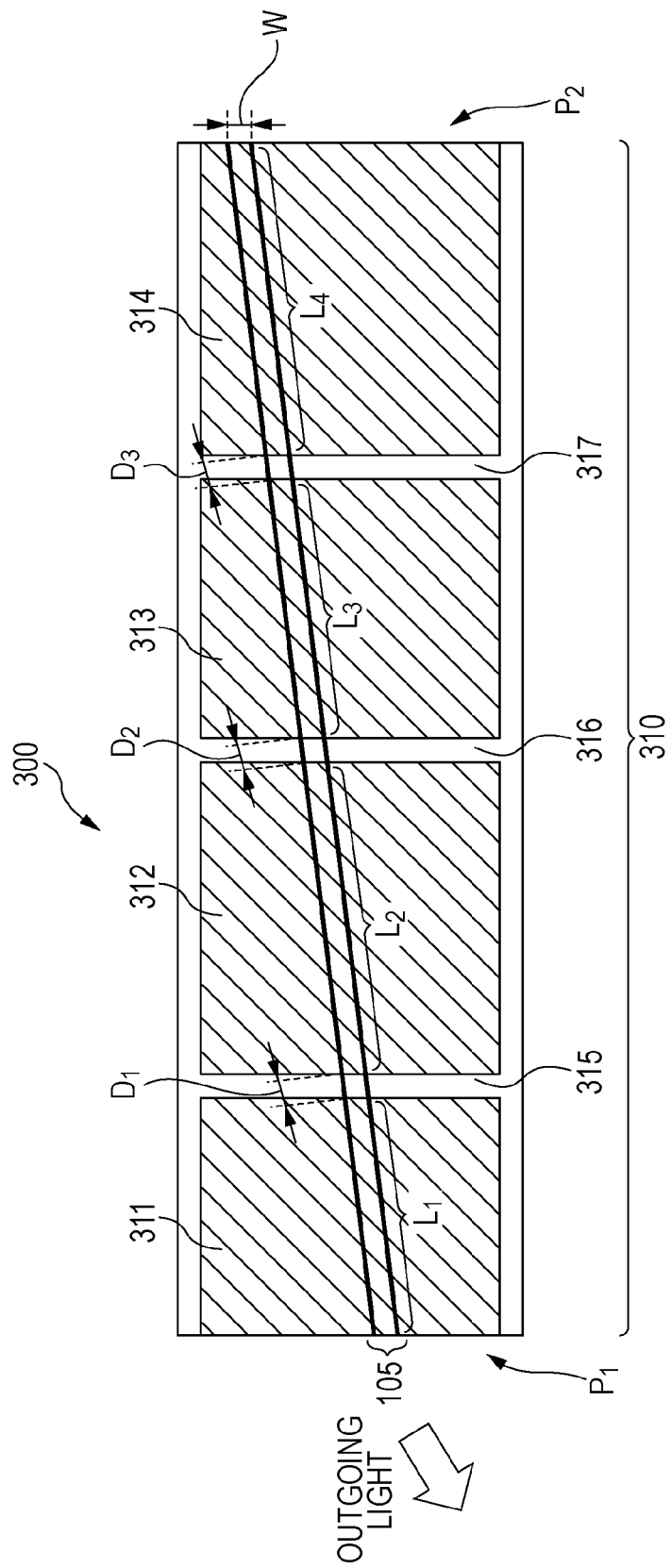
FIG. 5 is a diagram for explaining a configuration of a light emitting device according to a third exemplary embodiment of the present invention.

In the light emitting device according to this example, an upper electrode layer 310 is divided into a first electrode 311, a second electrode 312, a third electrode 313, and a fourth electrode 314, as illustrated in FIG. 5. Regarding lengths in a waveguide direction of the electrodes, the first electrode 311 has a length $L_1$ of 0.29 mm, the second electrode 312 has a length $L_2$ of 0.3 mm, the third electrode 313 has a length $L_3$ of 1.5 mm, and the fourth electrode 314 has a length $L_4$ of 0.3 mm.

Figure 13:
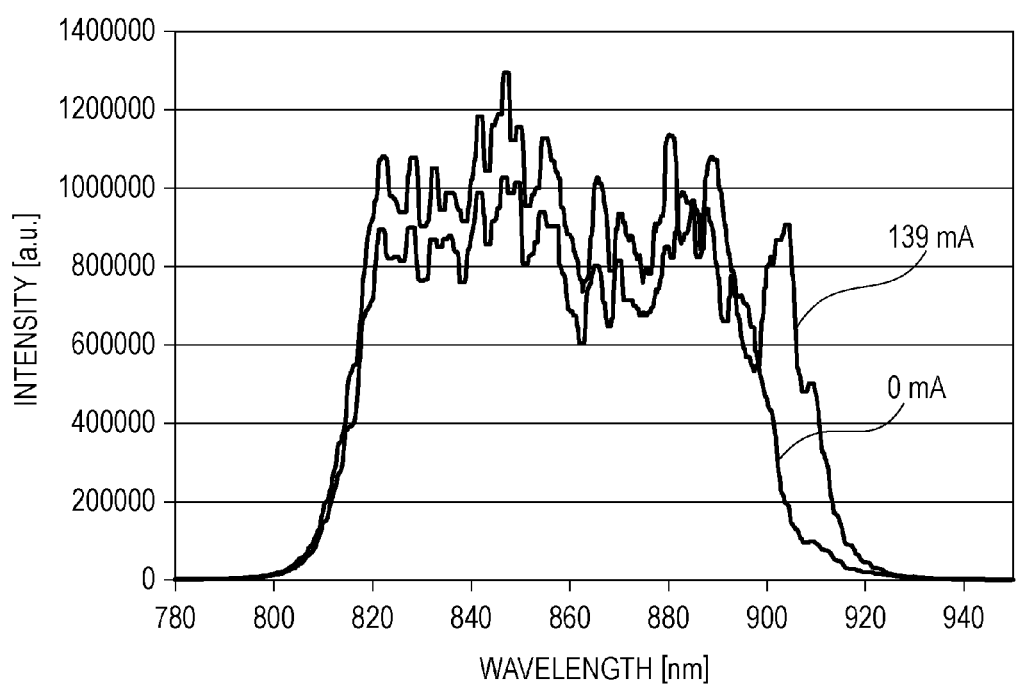
FIG. 13 is a graph showing an actual measurement result of an emission spectrum of a light emitting device according to a fifth example according to the present invention.

FIG. 13 illustrates changes in an emission spectrum when the current amount to be injected to the fourth electrode 314 is changed with electric current of 120 mA injected to the first electrode 311 and electric current of 3.8 mA injected to the second electrode 312. In this case, electric current is not injected to the third electrode 313. From the emission spectrum illustrated in FIG. 13, it is understood that an emitted light peak appears near a wavelength of 905 nm and that the half-width of the spectrum is equal to or higher than 90 nm. A peak appears near a wavelength of 905 nm because the third electrode 313 and the fourth electrode 314 are provided.

A mechanism for appearance of a peak near a wavelength of 905 nm in the graph illustrated in FIG. 13 may be considered as follows.

An active layer region corresponding to the third electrode 313 to which electric current is not injected absorbs light. Thus, inter-band absorption occurs in a short wavelength side from a ground level having a longest wavelength in the active layer. On the other hand, such inter-band absorption does not occur for light having a longer wavelength than it. On the other hand, in the fourth electrode 314 to which electric current is fed, a little amount of emitted light having a longer wavelength in the active layer than a longest wavelength of a level (ground level of the first quantum well structure) of quantum well structures included in the same active layer may occur because of generated heat or a carrier distribution even. Thus, when light emitted from the fourth electrode 314 passes through the third electrode 313, light of a component having a long wavelength may occur, which is not absorbed by a band gap in the ground level of the first quantum well structure of the third electrode 313.

This example may also provide both of the effect of the first example that light emission may be achieved at a lower level than a level on a short wavelength side and the effect produced by divided electrodes according to the fourth example. This example may further provide the effect that a spectrum width may be increased by providing an absorption region and a light emission region on end face opposite against an emission end with respect to the absorption region.

Sixth Example

A light emitting device according to a sixth example of the present invention will be described. Aspects according to this example have entirely the same configuration as that of the first example except for its quantum well structure. Differences from the first example will only be described below, and the descriptions on common matters will be omitted.

Figure 14A:
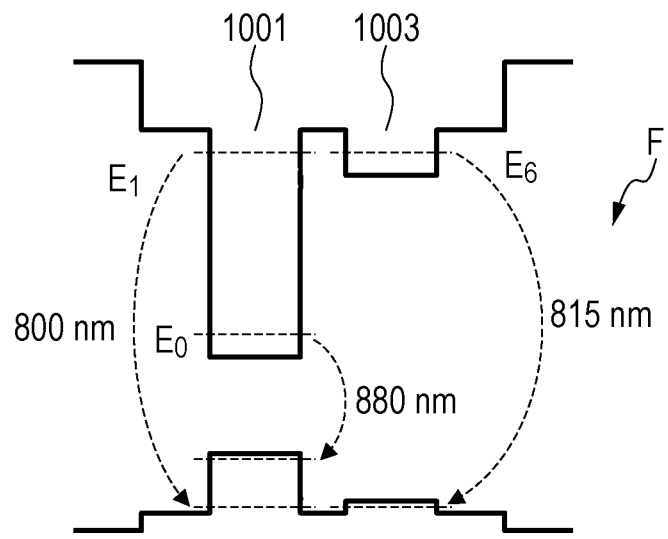
FIG. 14A is a band diagram of a quantum well structure in the light emitting device according to a sixth example of the present invention.
Figure 14B:
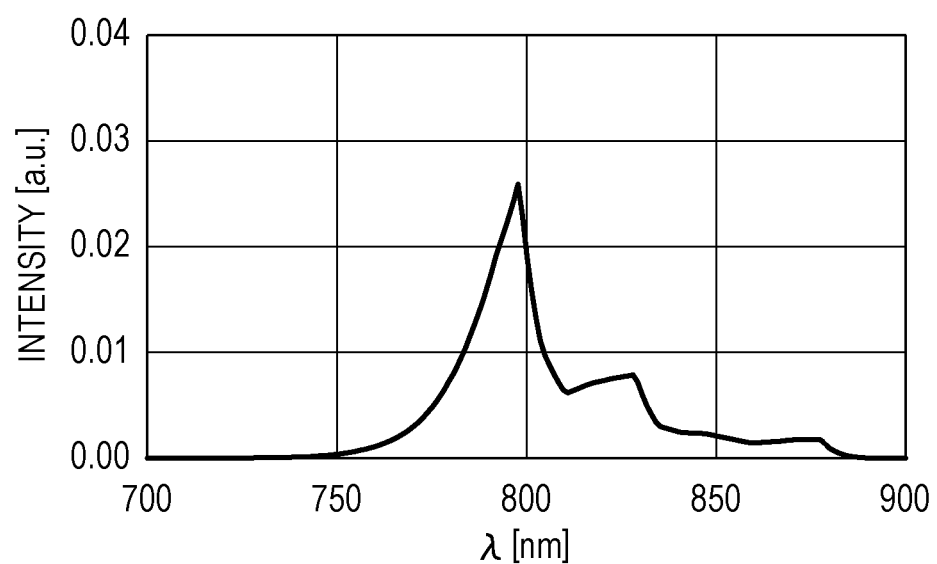
FIG. 14B is a calculation result of an emission spectrum in the light emitting device according to a sixth example of the present invention.

An active layer in a light emitting device according to this example has a quantum well structure (quantum well structure F) illustrated in a band diagram in FIG. 14A. That is, this example has a double quantum well structure having a first quantum well structure 1001 and a second quantum well structure 1003 similarly to the first example. The second quantum well structure 1003 has a 6 nm thick well layer containing $Al_{0.03}GaAs$ and 10 nm thick barrier layers containing $Al_{0.2}GaAs$ which sandwich the well layer. FIG. 14B illustrates a calculation result of an emission spectrum acquired by injecting electric current with an equal current injection density to that of the first example to an active layer having the quantum well structure F. Comparing with the first example, though a large energy level difference (about 30 meV) exists between a ground level $E_1$ of the first quantum well structure 1001 and a ground level $E_6$ of the second quantum well structure, the emission intensity is sufficient in a short wavelength band.

Second Comparative Example

A comparative example of the light emitting device according to the sixth example will be described. Aspects according to this comparative example have entirely the same configuration as that of the sixth example except for its quantum well structure.

The quantum well structure B is identical to the structure according to the first comparative example.

Figure 15A:
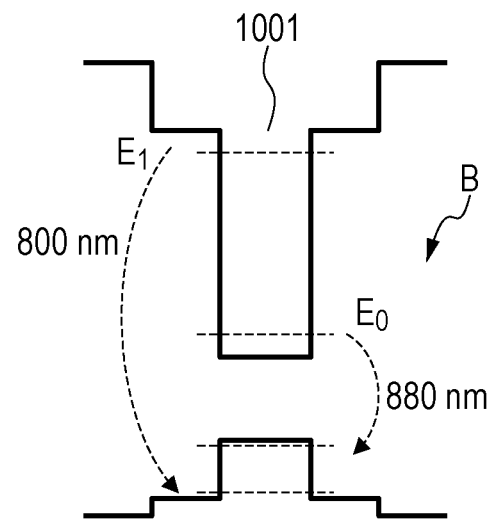
FIGS. 15A and 15B are band diagrams of a quantum well structure in a light emitting device according to a second comparative example of the present invention.
Figure 15B:
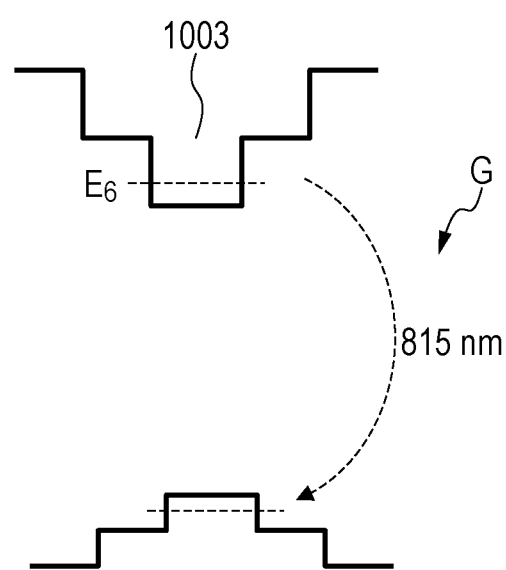

A quantum well structure G as illustrated in FIG. 15B is a single quantum well structure having one quantum well structure similarly to the second quantum well structure 1003 of the quantum well structure F.

Figure 16A:
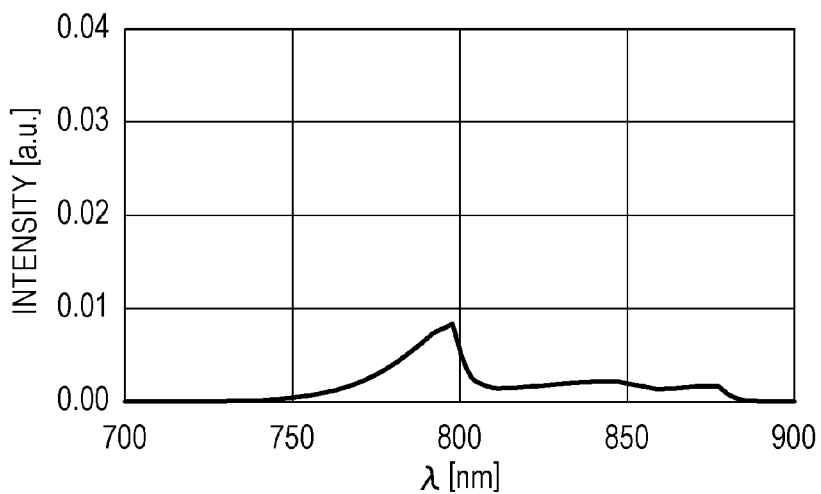
FIGS. 16A to 16C are graphs showing a calculation result of an emission spectrum of the light emitting device according to the second comparative example of the present invention.
Figure 16B:
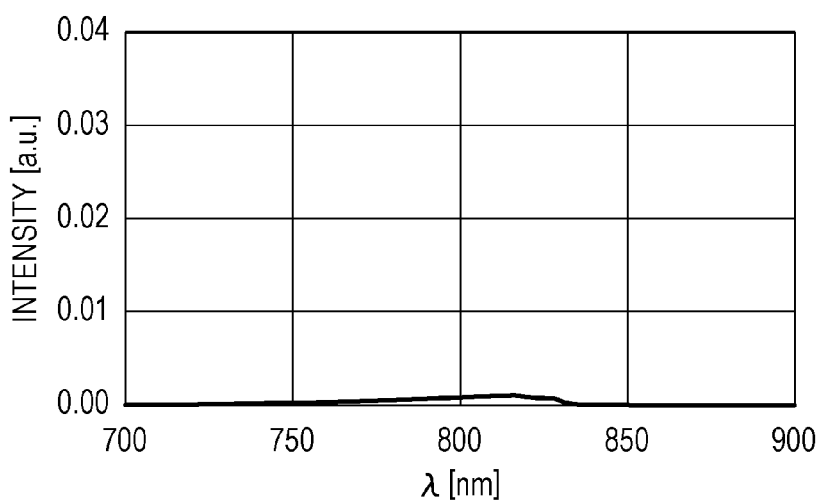
Figure 16C:
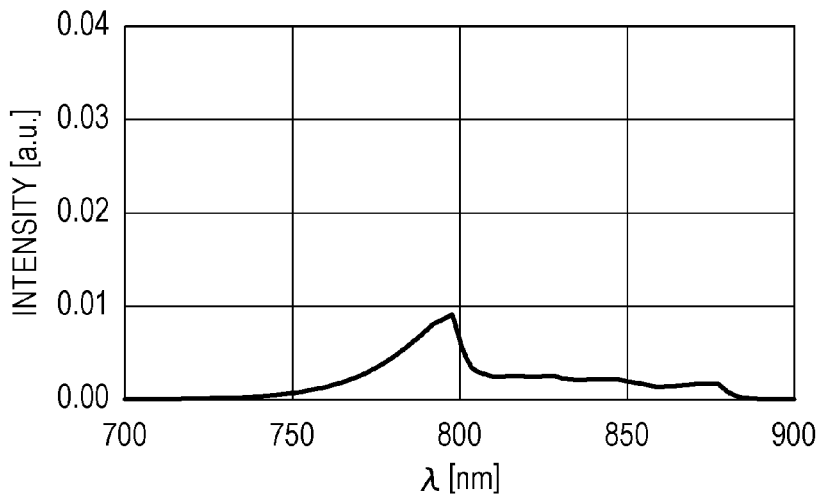

FIGS. 16A and 16B illustrate calculation results of an emission spectrum when electric current with an equal current injection density to that of the first example is injected to the quantum well structures B and G. FIG. 16C illustrates an emission spectrum acquired by adding the emission spectrums in FIG. 16A and FIG. 16B.

Comparing the peak intensity at a wavelength of about 800 nm, which is an emission wavelength from a primary level of the first quantum well structure 1001, in FIG. 14B and FIG. 16C, the peak intensity in FIG. 16C is high. From this, it is understood that when a plurality of quantum well structures are included in the active layer, an emission intensity equal to or higher than the intensity of the spectrum acquired by simply adding the emission spectrums of the active layers of single quantum well structures.

Seventh Example

A light emitting device according to a seventh example of the present invention will be described. According to this example, a calculation example of a change in emission intensity in a low wavelength band (834 nm) will be described which is caused by a change of an energy difference $\Delta E$ ($=E_2-E_1$) between a high-order level $E_1$ of a first quantum well structure and a ground level $E_2$ of a second quantum well structure in an active layer in a light emitting device according to the first example. A change of an emission intensity in a low wavelength band (834 nm) using the quantum well structures is calculated as a light emission intensity ratio by defining a sum of an emission intensity of a single quantum well structure having the first quantum well structure only and an emission intensity of a single quantum well structure having the second quantum well structure only as 1.

Aspects according to this example have the same configuration as that of the first example except for its quantum well structure. Differences from the first example will only be described below, and the descriptions on common matters will be omitted.

The configurations of this example may be divided into two of Groups (I) and (II).

In Group (I), a barrier layer is 10 nm wide, a first quantum well structure is an 8 nm thick well layer containing an $In_{0.15}GaAs$ layer, and a second quantum well structure is a 6 nm thick well layer containing an $Al_xGaAs$ layer or a 6 nm thick well layer containing an $In_yGaAs$ layer. The calculations are performed by changing x to 0, 0.01, 0.02, and 0.03 for the $Al_xGaAs$ layer and changing y to 0.023, 0.04, 0.06, 0.08, 0.10, and 0.12 for the $In_yGaAs$ layer in the second quantum well structure. In other words, because a change of the composition of the second quantum well structure may change the energy difference $\Delta E(=E_2-E_1)$ between the high-order level $E_1$ and the second ground level $E_2$ of the first quantum well structure, how the emission intensity changes with changes in $\Delta E$ was calculated. Changes in emission intensity were calculated as a light emission intensity ratio as follows. The light emission intensity ratio refers to an emission intensity at 834 nm in the aforementioned double quantum well structures when a sum of an emission intensity at 834 nm in a case where an active layer has the first quantum well structure only and an emission intensity at 834 nm in a case where the active layer has the second quantum well structures only are defined as 1.

The same calculations were performed for Group (II) which is the same as Group(I) except that the barrier layer is 30 nm thick.

layer having a composition containing $In_{0.023}GaAs$ of the second quantum well structure results in the highest light emission intensity ratio, and the effect caused by the substantially matched levels was verified. It is found that the emission intensity increase effect is significant with energy level differences $\Delta E$ from −110 meV to 25 meV, particularly from −45 meV to 20 meV. It is further found that the emission intensity increase effect is provided even when the thickness of the barrier layer is changed.

TABLE 1

| | STRUCTURE OF FIRST QUANTUM WELL | | STRUCTURE OF SECOND QUANTUM WELL | | ENERGY LEVEL DIFFERENCE | EMISSION INTENSITY RATIO (DOUBLE QUANTUM WELL STRUCTURE/ |
|---|---|---|---|---|---|---|
| | BARRIER LAYER | WELL LAYER | BARRIER LAYER | WELL LAYER | DELTA-E (meV) | SINGLE QUANTUM WELL STRUCTURE |
| GROUP (I) | $Al_{0.2}GaAs$ LAYER (10 nm THICK) | $In_{0.15}GaAs$ LAYER (8 nm THICK) | $Al_{0.2}GaAs$ LAYER (10 nm THICK) | $Al_{0.03}GaAs$ LAYER (6 nm THICK) | 58 | 1.19 |
| | | | | $Al_{0.02}GaAs$ LAYER (6 nm THICK) | 45 | 1.25 |
| | | | | $Al_{0.01}GaAs$ LAYER (6 nm THICK) | 33 | 1.23 |
| | | | | GaAs LAYER (6 nm THICK) | 21 | 1.75 |
| | | | | $In_{0.023}GaAs$ LAYER (6 nm THICK) | 0 | 5.23 |
| | | | | $In_{0.04}GaAs$ LAYER (6 nm THICK) | −21 | 5.34 |
| | | | | $In_{0.06}GaAs$ LAYER (6 nm THICK) | −41 | 4.84 |
| | | | | $In_{0.08}GaAs$ LAYER (6 nm THICK) | −62 | 3.85 |
| | | | | $In_{0.10}GaAs$ LAYER (6 nm THICK) | −84 | 3.05 |
| | | | | $In_{0.12}GaAs$ LAYER (6 nm THICK) | −106 | 2.43 |
| GROUP (II) | $Al_{0.2}GaAs$ LAYER (30 nm THICK) | $In_{0.15}GaAs$ LAYER (8 nm THICK) | $Al_{0.2}GaAs$ LAYER (30 nm THICK) | $Al_{0.03}GaAs$ LAYER (6 nm THICK) | 58 | 1.09 |
| | | | | $Al_{0.02}GaAs$ LAYER (6 nm THICK) | 45 | 1.14 |
| | | | | $Al_{0.01}GaAs$ LAYER (6 nm THICK) | 33 | 1.13 |
| | | | | GaAs LAYER (6 nm THICK) | 21 | 1.55 |
| | | | | $In_{0.023}GaAs$ LAYER (6 nm THICK) | 0 | 4.64 |
| | | | | $In_{0.04}GaAs$ LAYER (6 nm THICK) | −21 | 4.72 |
| | | | | $In_{0.06}GaAs$ LAYER (6 nm THICK) | −41 | 4.11 |
| | | | | $In_{0.08}GaAs$ LAYER (6 nm THICK) | −62 | 3.43 |
| | | | | $In_{0.10}GaAs$ LAYER (6 nm THICK) | −84 | 2.73 |
| | | | | $In_{0.12}GaAs$ LAYER (6 nm THICK) | −106 | 2.19 |

The emission wavelength of the primary level in the single quantum well structure having the 8 nm thick $In_{0.15}GaAs$ well layer is 834 nm, which is equal to an emission wavelength of the ground level in the single quantum well structure having the 6 nm thick $In_{0.023}GaAs$ well layer. In other words, in the double quantum well structure having the two quantum well structures, the primary level of the 8 nm thick $In_{0.15}GaAs$ well layer and the ground level of the 6 nm thick $In_{0.023}GaAs$ well layer are substantially matched.

Figure 17A:
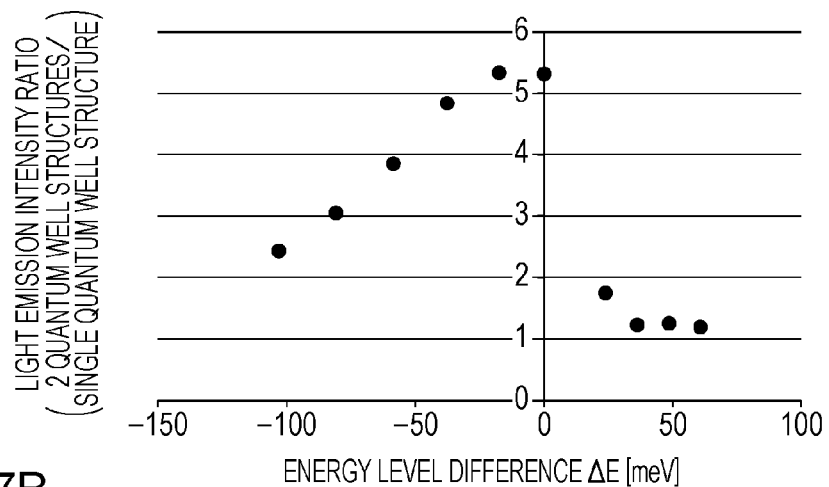
FIGS. 17A to 17C are graphs showing a relationship between an energy level difference ΔE and a light emission intensity ratio according to a seventh embodiment of the present invention.
Figure 17B:
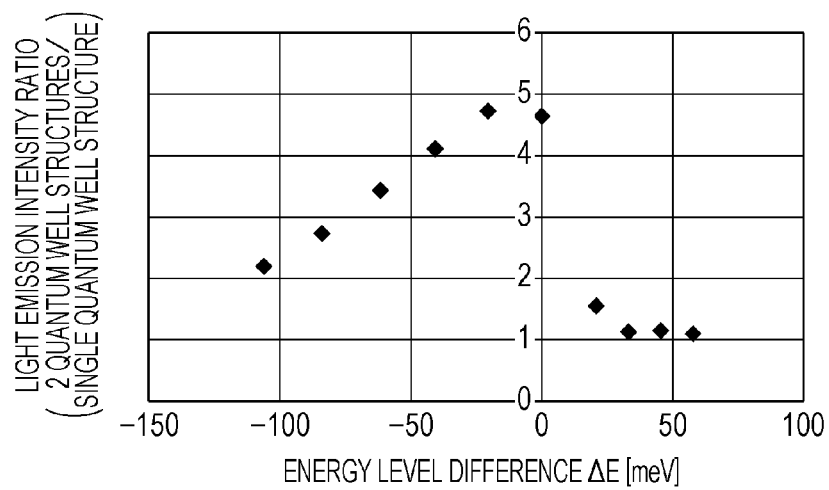
Figure 17C:
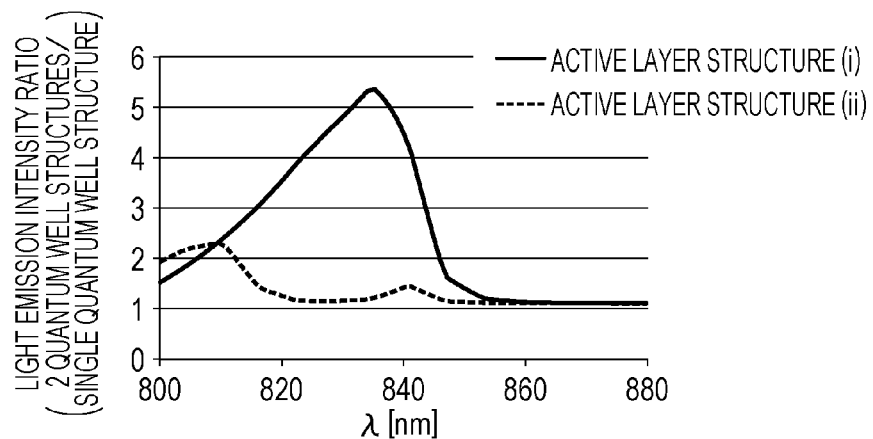

FIG. 17A illustrates calculation results for the first group, FIG. 17B illustrates calculation results for the second group. Table 1 summarizes used quantum well structures and light emission intensity ratios. Referring to FIG. 17A, the well FIG. 17C illustrates a light emission intensity ratio of the double quantum well structure to the single quantum well structure. It may be calculated by dividing an emission intensity at each wavelength of an emission spectrum of a double quantum well structure by a sum of emission intensities at each wavelength of emission spectrums of two quantum well structures included in a double quantum well where each of the quantum well structures are considered as a separate single quantum well structure. For example, FIG. 17C illustrates a calculation example in a double quantum well structure having 8 nm thick $In_{0.15}GaAs$ and 6 nm thick $In_{0.023}GaAs$ as well layers and a double quantum well structure having 8 nm thick $In_{0.15}GaAs$ and 6 nm thick $Al_{0.03}GaAs$ as well layers. FIG. 17C illustrates a calculation result where the former is an active layer structure (i) and the latter is an active layer structure (ii).

The active layer structure (i) has a particularly high light emission intensity ratio at a wavelength of 834 nm where the energy levels are substantially equal, and the intensity increase effect may be significant to some extent in the other wavelength bands. On the other hand, the active layer structure (ii) has a lower emission intensity increase effect than the active layer structure(i) because it has a larger energy level difference ΔE than the active layer structure(i).

Eighth Example

A light emitting device according to an eighth example of the present invention will be described with reference to FIGS. 18A and 18B. A light emitting device according to the eighth example of the present invention has an identical configuration to that of the fourth example except that an upper electrode layer is divided into six. Differences from the fourth example will only be described below, and the descriptions on common matters will be omitted.

The light emitting device according to this example has an upper electrode layer divided into a first electrode, a second electrode, a third electrode, a fourth electrode, a fifth electrode, and a sixth electrode, as illustrated in FIG. 18A. Regarding lengths in a waveguide direction of the electrodes, the first electrode has a length $L_1$ of 0.3 mm, the second electrode has a length $L_2$ of 0.2 mm, the third electrode has a length $L_3$ of 0.3 mm, the fourth electrode has a length $L_4$ of 0.4 mm, the fifth electrode has a length $L_5$ of 0.2 mm, and the sixth electrode has a length $L_6$ of 0.3 mm. The first electrode, second electrode, fourth electrode, and sixth electrode are driven with positive electric current, and the third electrode and fifth electrode are driven with zero or negative electric current.

Feeding electric current from the upper electrode side to the lower electrode side will be called positive electric current driving, and feeding electric current from the lower electrode side to the upper electrode side will be called negative electric current driving. The third electrode is driven with an electric current density equal to or higher than the electric current density in the fifth electrode. This may inhibit absorption in the third electrode of emitted light at a wavelength having an emitted light peak formed by the fifth electrode and the sixth electrode. FIG. 18B illustrates an emission spectrum of outgoing light from a light emitting device in a case where the electric current injected to the first electrode is 126 mA, the electric current injected to the second electrode is 9.8 mA, the electric current injected to the third electrode is 0 mA, the electric current injected to the fourth electrode is 20 mA, the electric current injected to the fifth electrode is −20 mA, and the electric current injected to the sixth electrode is 96 mA. Referring the emission spectrum illustrated in FIG. 18B, an emitted light peak appears near a wavelength of 900 nm and near a wavelength of 910 nm, and the half-width of the spectrum is equal to or higher than 95 nm. The emitted light peak appearing near a wavelength of 900 nm is caused by the third electrode and the fourth electrode, and the emitted light peak appearing near a wavelength of 910 nm is caused by the fifth electrode, and the emitted light peaks appear because the length of the sixth electrode and the driving state (electric current density) are appropriately adjusted.

Advantages of this example will be described, compared with the fifth example. The absorption amount in an absorption region or a region to which electric current is not injected or to which negative electric current is injected (negative bias voltage is applied) may be increased to shift a peak more to a long wavelength side and thus increase the emission spectrum band. However, because of it, a dip may easily occur in the spectrum. In order to prevent easy occurrence of a dip, (1) the amplification effect caused by simulated emission may be reduced to increase the width of each peak, (2) the interval between a peak at a shortest wavelength and a peak at a longest wavelength may be reduced, or (3) a new peak may be generated in a dip part to fill the dip, for example. (1) may result in a smaller output, and (2) may result in a narrowed emission spectrum band. In a case where high-output and wide-band light is required as a light source for OCT, the technique (3) may be the best.

By increasing the number of electrodes, the number of peaks included in the resulting emission spectrum may be increased. Adjusting the absorption amount in the absorption region may allow substantially free control of a peak wavelength in the emission spectrum. Therefore, according to this example, the addition of the fifth electrode and sixth electrode to the fifth example may allow fine control of a spectrum shape. This example may provide both of the effect that light is emitted in a level on a short wavelength side with a lower electric current density and the effect produced by divided electrodes also provided by the first example. Furthermore, this example provides the effect that a spectrum shape may be more freely controlled than the fifth example by providing an absorption region and a light emission region on an opposite end face side against an outgoing end with respect to the absorption region (end face opposite against the end face with outgoing light illustrated in FIG. 18A).

Ninth Example

Figure 19:
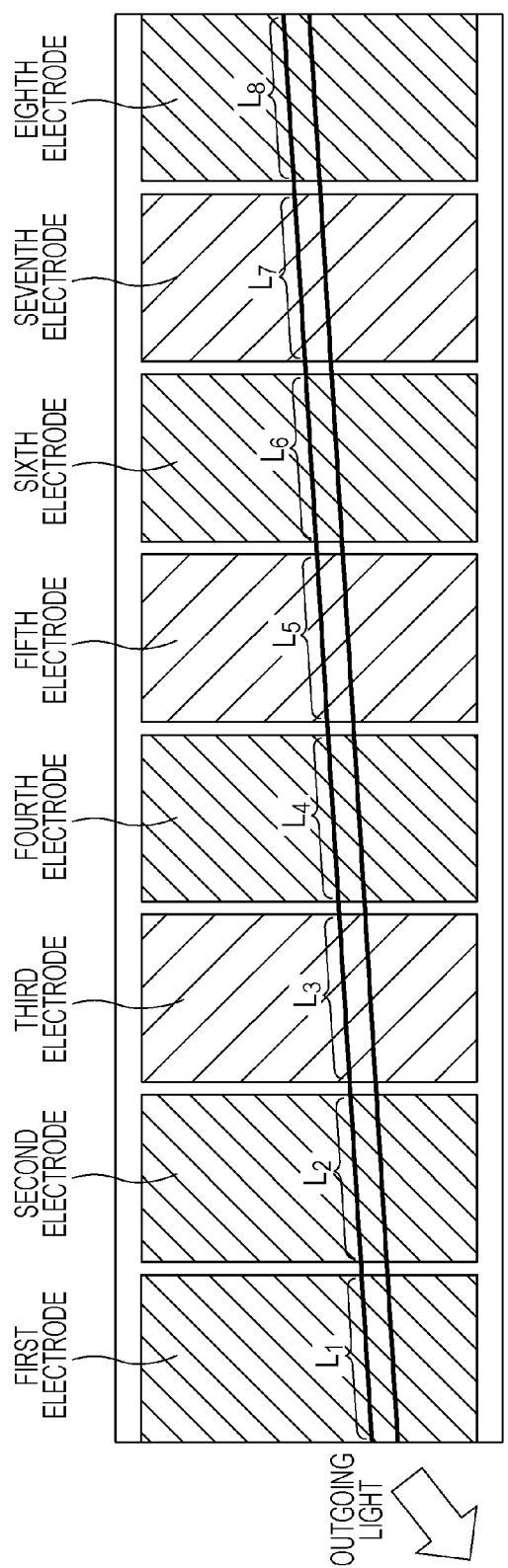
FIG. 19 is a diagram for explaining a configuration of a light emitting device according to a ninth example of the present invention.

A light emitting device according to a ninth example of the present invention will be described with reference to FIG. 19.

A light emitting device according to the ninth example of the present invention has an identical configuration to that of the fourth example except that an upper electrode layer is divided into eighth. Differences from the fourth example will only be described below, and the descriptions on common matters will be omitted. The light emitting device according to this example has an upper electrode layer divided into a first electrode, a second electrode, a third electrode, a fourth electrode, a fifth electrode, a sixth electrode, a seventh electrode, and an eighth electrode as illustrated in FIG. 19. Regarding lengths in a waveguide direction of the electrodes, the first electrode has a length $L_1$ of 0.3 mm, the second electrode has a length $L_2$ of 0.2 mm, the third electrode has a length $L_3$ of 0.3 mm, the fourth electrode has a length $L_4$ of 0.4 mm, the fifth electrode has a length $L_5$ of 0.2 mm, the sixth electrode has a length $L_6$ of 0.3 mm, the seventh electrode has a length $L_7$ of 0.2 mm, and the eighth electrode has a length $L_8$ of 0.3 mm. The first electrode, second electrode, fourth electrode, sixth electrode, and eighth electrode are driven with positive electric current, and the third electrode, fifth electrode, and the seventh electrode is driven with zero or negative electric current. The third electrode is driven with an electric current density equal to or higher than the electric current density in the fifth electrode, and the fifth electrode is driven with an electric current density equal to or higher than the electric current density in the seventh electrode. This may prevent absorption by the third electrode of emitted light peaks formed by the fifth electrode and sixth electrode and absorption by the third electrode and fifth electrode of emitted light peaks formed by the seventh electrode and eighth electrode.

By increasing the number of electrodes, the number of peaks to be formed may be increased, as in the eighth example. In this example, a region (seventh electrode) which is driven with reverse bias (negative electric current) and in which a short wavelength component is absorbed and a light emission region (eighth electrode) are added in rear of the sixth electrode (end face side opposite against an end face with illustrated outgoing light, the same is true below). Thus, peaks generated by those electrodes may be used for extending a spectrum band and filling a dip in the spectrum as in the eighth exemplary embodiment or may be used for supporting the fifth electrode and sixth electrode. For example, identical lengths and driving states of the fifth electrode and the seventh electrode and identical lengths and driving states of the sixth electrode and the eighth electrode may be defined so that the magnitude of a peak generated by them may be increased, easy control of the magnitude may be allowed, or the degradation speed of those electrode regions may be reduced, for example. This example may provide both of the effect that light is emitted in a level on a short wavelength side with a lower electric current density and the effect produced by divided electrodes also provided by the first example. Furthermore, this example provides the effect that controllability over a spectrum shape and stability of optical characteristics may be improved more than the fifth and eighth examples by providing an absorption region and a light emission region on an opposite end face side against an outgoing end with respect to the absorption region.

Tenth Example

A light emitting device according to a tenth example of the present invention will be described with reference to FIG. 20. The light emitting device according to the tenth example of the present invention has an upper electrode layer divided into four, and a light guide is diverged into two within a first electrode region. The other configuration of this example is the same as that of the fourth example. Differences from the fourth example will only be described below, and the descriptions on common matters will be omitted.

Figure 20:
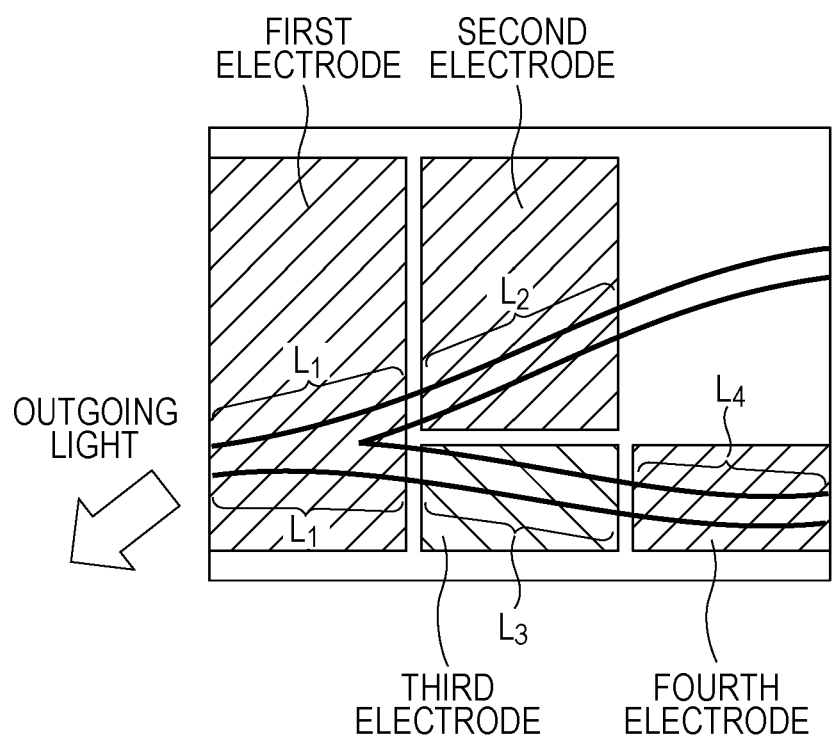
FIG. 20 is a diagram for explaining a configuration of a light emitting device according to a tenth example of the present invention.

The light emitting device according to this example has an upper electrode layer divided into a first electrode, a second electrode, a third electrode, and a fourth electrode, as illustrated in FIG. 20. Regarding lengths in a waveguide direction of the electrodes, the first electrode has a length $L_1$ of 0.3 mm, the second electrode has a length $L_2$ of 0.3 mm, the third electrode has a length $L_3$ of 0.1 mm, and the fourth electrode has a length $L_4$ of 0.3 mm. A light guide has a radius of curvature of 1 mm at the diverged part, the light guide near an outgoing end may be tilted by about 7° in an in-plane direction of an active layer with respect to a perpendicular line of an outgoing end face. The first electrode, second electrode, and fourth electrode are driven with positive electric current, and the third electrode is driven with zero or negative electric current.

An emission spectrum when the electric current to be injected to the first electrode is 120 mA, the electric current to be injected to the second electrode is 3.8 mA, the electric current to be injected to the third electrode is 0 mA, and the electric current to be injected to the fourth electrode is changed is assumed to be substantially equal to that of FIG. 13 without considering a waveguide loss.

Diverging a light guide may provide an effect that a sample length may be reduced for acquiring an equivalent optical characteristic, compared with a sample of waveguide not diverged. Furthermore, there is an effect that the degree of freedom for electrode configurations and driving states may be increased.

Advantages acquired by combining the active layer structure according to the present invention and the light guide and electrode configurations of this example will be described below.

For example, the fifth example may be considered as having a waveguide which is not diverged and as providing substantially equivalent spectrum controllability and optical characteristics to those of this example. Emitted light peaks generated by the third electrode and fourth electrode according to the fifth example correspond to emitted light peaks generated by the third electrode and the fourth electrode according to this example. These emitted light peaks may be required to be sufficiently amplified in a light emission region in front of an absorption region(the third electrode in the fifth example or the third electrode in this example). In the fifth example, the light emission region for the amplification corresponds to the first electrode and second electrode while it corresponds the first electrode only in the tenth example. Therefore, it is important for the first electrode not to be easily degraded in order to keep magnitudes of peaks from the rear side. In other words, the effect that light emission of a high-order level is allowed without increasing a current injection density to an active layer because of the active layer structure of the present invention may reduce a load on the first electrode and thus prevent degradation thereof. Therefore, light from a rear side may be amplified in a stable manner.

Having described that the light guide has a radius of curvature of 1 mm at its curved part according to this example, the radius of curvature is not limited thereto as far as it falls in a range for preventing extreme degradation of an optical characteristic in a connection part of a curved part and a curved line and a straight line. A waveguide structure may be provided in which two straight waveguides are provided as a starting point of a branch. Such a starting point of the branch may not exist within the first electrode region. For example, the same effect may be expected even with a starting point of the branch within the second electrode region.

This example also provides the effect that light emission is achieved with a lower electric current density on a short wavelength side according to the first example, the effect of divided electrodes, and the effect of a diverged light guide. Furthermore, this example provides the effect that controllability over a spectrum shape and degrees of freedom in a branch of a waveguide and electrode configurations may be improved more than the fifth example by providing an absorption region and a light emission region on an opposite end face side against an outgoing end with respect to the absorption region.

Eleventh Example

A light emitting device according to an eleventh example of the present invention will be described with reference to FIG. 21A.

The light emitting device according to the eleventh example of the present invention has an upper electrode layer divided into six, and a light guide is diverged into two within a first electrode region. The other configuration of this example is the same as that of the tenth example.

Differences from the tenth example will only be described below, and the descriptions on common matters will be omitted.

Figure 21A:
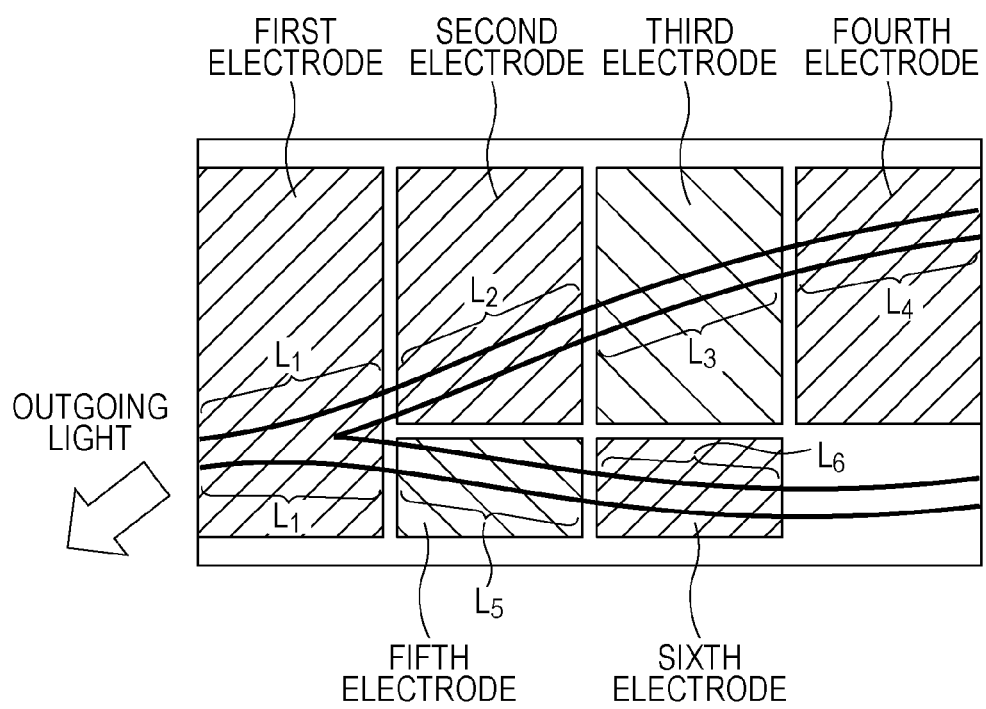
FIG. 21A is a diagram for explaining a configuration of a light emitting device according to an eleventh example according to the present invention.
Figure 21C:
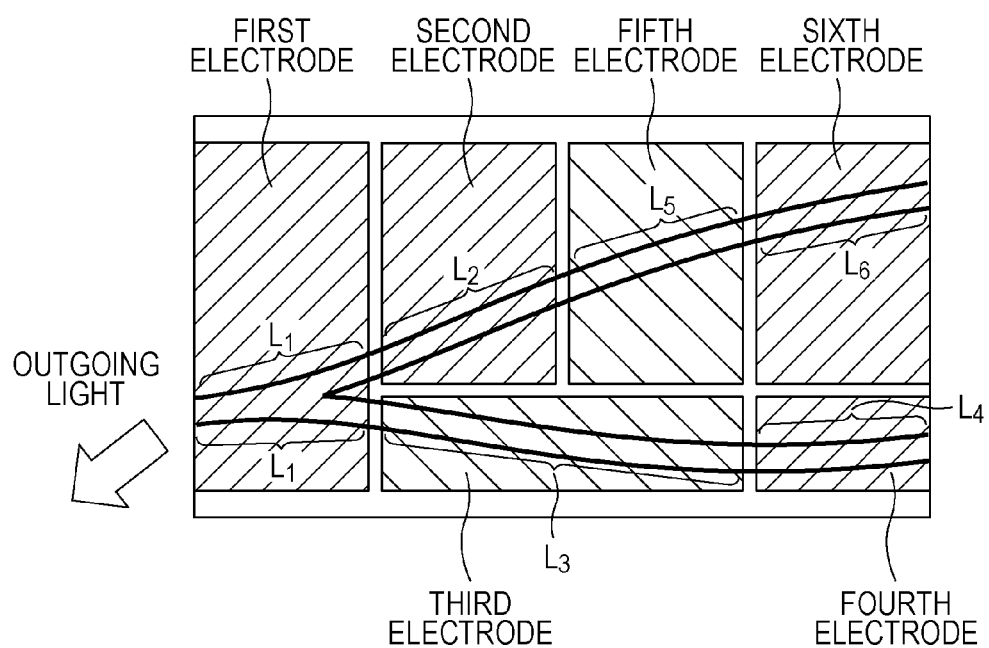

The light emitting device according to this example has an upper electrode layer divided into a first electrode, a second electrode, a third electrode, a fourth electrode, a fifth electrode, and a sixth electrode, as illustrated in FIG. 21A. Regarding lengths in a waveguide direction of the electrodes, the first electrode has a length $L_1$ of 0.3 mm, the second electrode has a length $L_2$ of 0.2 mm, the third electrode has a length $L_3$ of 0.3 mm, the fourth electrode has a length $L_4$ of 0.4 mm, the fifth electrode has a length $L_5$ of 0.2 mm, and the sixth electrode has a length $L_6$ of 0.3 mm. The first electrode, second electrode, fourth electrode, and sixth electrode are driven with positive electric current, and the third electrode and fifth electrode are driven with zero or negative electric current. It should be noted that the third electrode and the fifth electrode, and the fourth electrode and the sixth electrode are interchangeable because of their electrode configurations. Diverging a light guide may provide an effect that a sample length (which is a length between an outgoing end face of a sample and an end face on the opposite side) may be reduced for acquiring an equivalent optical characteristic, compared with a sample of waveguide not diverged. Furthermore, there is an effect that the degree of freedom for electrode configurations and driving states may be increased. In a case where the length of the third electrode, for example, is required to increase in FIG. 21A, a configuration as illustrated in FIG. 21C may be applied rather than a configuration in FIG. 21B so that the sample length may be reduced without deteriorating its controllability and optical characteristic.

Figure 21D:
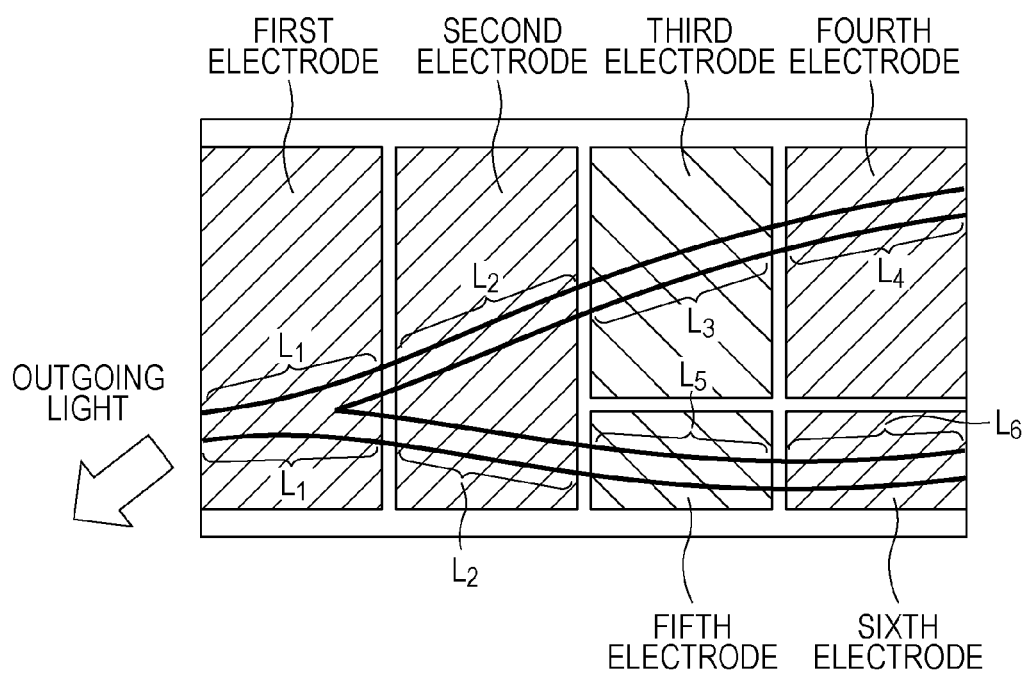

As illustrated in FIG. 21D, the second electrode may be provided across over both diverged waveguides. This may provide an effect that the magnitude of a peak generated by the second electrode may be increased and an effect that the electrode length may be reduced so that an equal electric current density may be applied.

This example also provides the effect that light emission is achieved with a lower electric current density on a short wavelength side according to the first example, the effect of divided electrodes, and the effect of a diverged light guide. Furthermore, this example provides the effect that controllability over a spectrum shape and degrees of freedom in a branch of a waveguide and electrode configurations may be improved more than the tenth example by providing an absorption region and a light emission region on an opposite end face side against an outgoing end with respect to the absorption region.

Twelfth Example

A light emitting device according to a twelfth example of the present invention will be described with reference to FIG. 22A.

The light emitting device according to the twelfth example of the present invention has an upper electrode layer divided into eight, and a light guide is diverged into two within a first electrode region. The other configuration of this example is the same as that of the tenth example. Differences from the tenth example will only be described below, and the descriptions on common matters will be omitted. The light emitting device according to this example has an upper electrode layer divided into a first electrode, a second electrode, a third electrode, a fourth electrode, a fifth electrode, a sixth electrode, a seventh electrode, and an eighth electrode, as illustrated in FIG. 22A. Regarding lengths in a waveguide direction of the electrodes, the first electrode has a length $L_1$ of 0.3 mm, the second electrode has a length $L_2$ of 0.2 mm, the third electrode has a length $L_3$ of 0.3 mm, the fourth electrode has a length $L_4$ of 0.4 mm, the fifth electrode has a length $L_5$ of 0.2 mm, the sixth electrode has a length $L_6$ of 0.3 mm, the seventh electrode has a length $L_7$ of 0.2 mm, and the eighth electrode has a length $L_8$ of 0.3 mm. The first electrode, second electrode, fourth electrode, sixth electrode, and eighth electrode are driven with positive electric current, and the third electrode, fifth electrode, and seventh electrode are driven with zero or negative electric current. The fifth electrode is driven with an electric current density equal to or higher than the electric current density for driving the seventh electrode. This may prevent absorption by the fifth electrode of emitted light peaks formed by the seventh electrode and eighth electrode.

Diverging a light guide may provide an effect that a sample length may be reduced for acquiring an equivalent optical characteristic, compared with a sample of waveguide not diverged. Furthermore, there is an effect that the degree of freedom for electrode configurations and driving states may be increased.

Figure 22B:
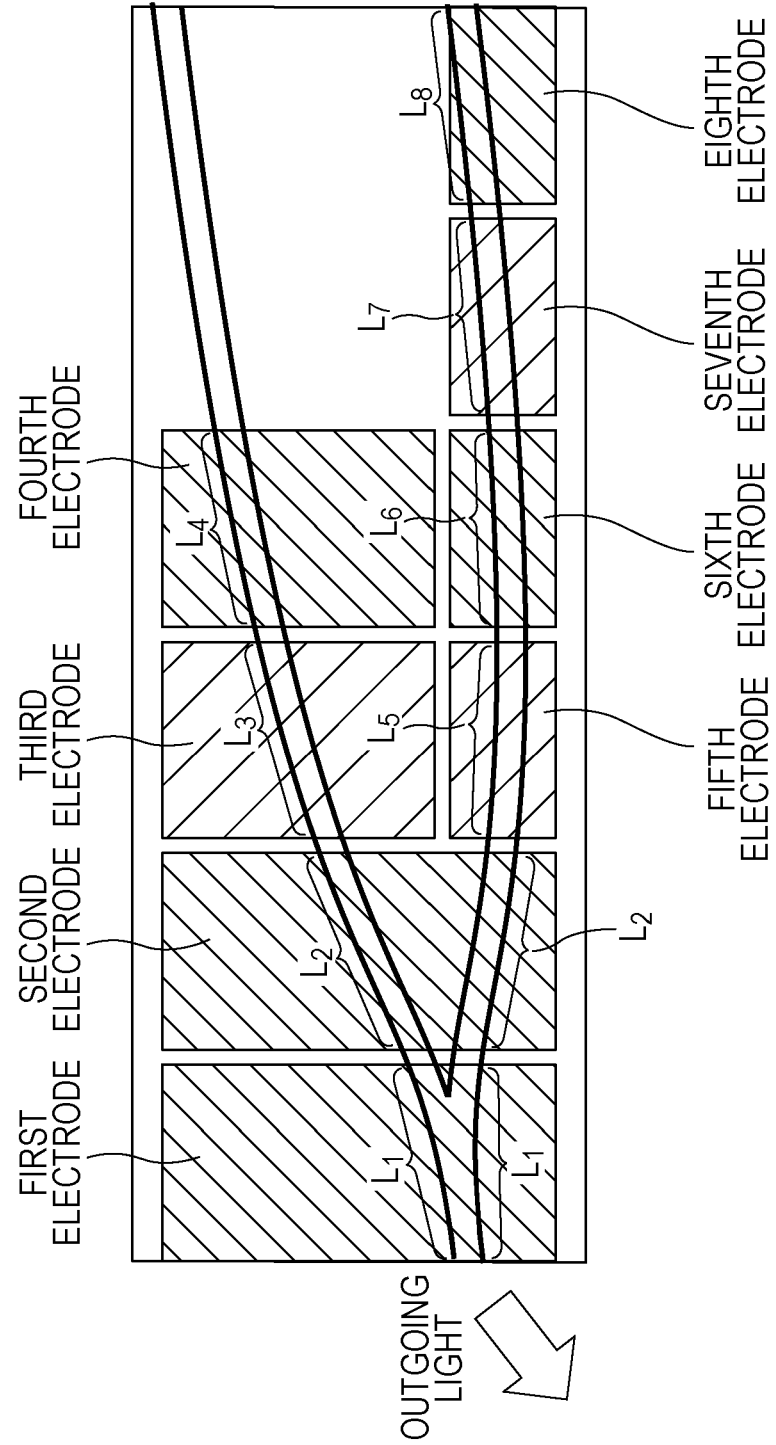
FIG. 22B is a diagram for explaining another configuration of the light emitting device according to the twelfth example of the present invention.

As illustrated in FIG. 22B, the second electrode may be provided across over both diverged waveguides. This may provide an effect that the magnitude of a peak generated by the second electrode may be increased and an effect that the electrode length may be reduced so that an equal electric current density may be applied.

This example also provides the effect that light emission is achieved with a lower electric current density on a short wavelength side according to the first example, the effect of divided electrodes, and the effect of a diverged light guide. Furthermore, this example provides the effect that controllability over a spectrum shape and degrees of freedom in a branch of a waveguide and electrode configurations may be improved more than the eleventh example by providing an absorption region and a light emission region on an opposite end face side against an outgoing end with respect to the absorption region.

Thirteenth Example

A light emitting device according to a thirteenth example of the present invention will be described with reference to FIG. 23A.

The light emitting device according to the tenth example of the present invention has an upper electrode layer divided into four. A light guide is diverged into two within a first electrode region, and the diverged light guides have an identical electrode pattern. The other configuration of this example is the same as that of the fourth example. Differences from the tenth example will only be described below, and the descriptions on common matters will be omitted.

Figure 23A:
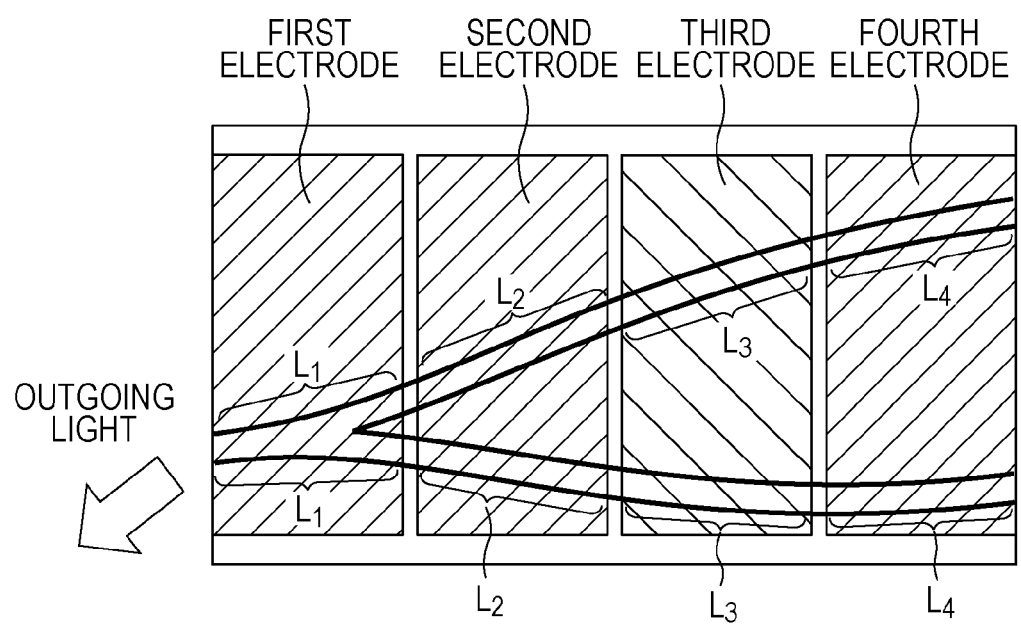
FIG. 23A is a diagram for explaining a configuration of a light emitting device according to a thirteenth example of the present invention.

The light emitting device according to this example has an upper electrode layer divided into a first electrode, a second electrode, a third electrode, and a fourth electrode, as illustrated in FIG. 23A. Regarding lengths in a waveguide direction of the electrodes, the first electrode has a length $L_1$ of 0.29 mm, second electrode has a length $L_2$ of 0.3 mm, third electrode has a length $L_3$ of 1.5 mm, and fourth electrode has a length $L_4$ of 0.3 mm. The first electrode, second electrode, and fourth electrode are driven with positive electric current, and the third electrode is driven with zero or negative electric current. In other words, a structure is acquired in which the waveguide according to the fifth example is diverged into two within the first electrode. An emission spectrum when the electric current to be injected to the first electrode is 120 mA, the electric current to be injected to the second electrode is 3.8 mA, the electric current to be injected to the third electrode is 0 mA, and the electric current to be injected to the fourth electrode is changed is assumed to be substantially equal to that of FIG. 13 without considering a waveguide loss.

Advantages acquired by combining the active layer structure according to the present invention and the light guide and electrode configurations of this example are as described according to the tenth example. However, in this case, because the emission intensity of light on a long wavelength side guided from a further rear part is high, the emitted light amount in the first electrode may be required to increase. Thus, the effect that light emission of a high-order level is allowed without increasing a current injection density to an active layer because of the active layer structure of the present invention may reduce a load on the first electrode and thus prevent degradation thereof. Therefore, light from a rear side may be amplified in a stable manner. Furthermore, the emitted light amount on the short wavelength side may be adjusted to the same extent as the emitted light amount on the long wavelength side.

Having illustrated in FIG. 23A the structure in which one electrode is across over two light guides. However, electrodes may not be electrically connected on a sample, but separated electrodes may be connected with a metallic wire, for example. Alternatively, only partial electrodes may be electrically connected.

The light guide may be diverted into three or more.

Instead of the structure in FIG. 23A in which the light guide FIG. 5 is diverged into two, the same effect may be provided by the structure in FIG. 23C in which the light guide in FIG. 23B and 20 acquired by diverging the light guide in FIG. 18 into two is further diverged into two.

This example also provides the effect that light emission is achieved with a lower electric current density on a short wavelength side according to the first example, the effect of divided electrodes, and the effect of a diverged light guide. This example in which a waveguide is diverged may further provide an effect that the emitted light amount may be increased while keeping the corresponding spectrum shape.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-067023, filed Mar. 27, 2014, which is hereby incorporated by reference herein in its entirety.

The invention claimed is:

1. A light emitting device comprising:
an upper electrode layer, a lower electrode layer, and an active layer provided between the upper electrode layer and the lower electrode layer;
the active layer has a plurality of quantum-confined structures including:
a first quantum-confined structure that has a ground level having an energy level $E_0$ and a high-order level having an energy level $E_1$; and
a second quantum-confined structure different from the first quantum-confined structure, the second quantum-confined structure has a ground level having an energy level $E_2$ which is higher than the energy level $E_0$,
wherein the energy level $E_1$ and the energy level $E_2$ are substantially matched, and
wherein at least one of the upper electrode layer and the lower electrode layer is divided into a plurality of electrodes.

2. The light emitting device according to claim 1, wherein the quantum-confined structures are quantum well structures.

3. The light emitting device according to claim 1, wherein an energy level difference $\Delta E$ acquired by subtracting the energy level $E_1$ from the energy level $E_2$ is equal to or higher than −110 meV and equal to or lower than 25 meV.

4. The light emitting device according to claim 1, wherein an energy level difference $\Delta E$ acquired by subtracting the energy level $E_1$ from the energy level $E_2$ is equal to or higher than than −45 meV.

5. The light emitting device according to claim 1, wherein an absolute value of an energy level difference $\Delta E$ acquired by subtracting the energy level $E_1$ from the energy level $E_2$ is equal to or lower than 20 meV.

6. The light emitting device according to claim 1, wherein an energy level difference $\Delta E$ acquired by subtracting the energy level $E_1$ from the energy level $E_2$ is equal to or lower than 0 meV.

7. The light emitting device according to claim 1, wherein an energy level difference $\Delta E$ acquired by subtracting the energy level $E_1$ from the energy level $E_2$ is equal to or lower than −21 meV.

8. The light emitting device according to claim 1, wherein a width of the second quantum-confined structure is different than a width of the first quantum-confined structure.

9. The light emitting device according to claim 1, wherein the active layer has three or more quantum-confined structures.

10. The light emitting device according to claim 1, wherein at least one electrode layer of the upper electrode layer and the lower electrode layer is divided into four electrodes.

11. The light emitting device according to claim 1, wherein the quantum-confined structures further include a third quantum-confined structure, and
wherein the third quantum-confined structure has a same structure as the first quantum-confined structure.

12. The light emitting device according to claim 1, wherein the light emitting device has a ridge optical waveguide structure.

13. The light emitting device according to claim 12, wherein the waveguide structure tilts in an in-plane direction of the active layer with respect to a perpendicular line of an outgoing end face of the light emitting device.

14. A light source system comprising:
the light emitting device according to claim 1; and
a control unit configured to control an electric current injection amount to the upper electrode layer and the lower electrode layer.

15. The optical coherence tomography comprising:
the light source system according to claim 14;
a coherent optical system configured to demultiplex light from the light source system to irradiation light which is to be irradiated to an object and reference light and generating reflected light of light irradiated to the object and coherent light generated with the reference light;
a spectroscope configured to separate the coherent light;
a coherent light detection unit configured to receive the separated coherent light;
an information acquisition unit configured to acquire information on the object based on an intensity of the coherent light.

16. The light emitting device according to claim 14, wherein the control unit is configured to inject electric current to a part of the plurality of electrodes.

17. The light emitting device according to claim 1, wherein the second quantum-confined structure is different from the first quantum-confined structure in at least one of depth and width dimensions.

18. The light emitting device according to claim 1, wherein the upper electrode layer includes a p-type cladding layer and the lower electrode layer includes a n-type cladding layer.

* * * * *